US009812364B2

United States Patent
Kim

(10) Patent No.: US 9,812,364 B2
(45) Date of Patent: Nov. 7, 2017

(54) METHOD OF FABRICATING SEMICONDUCTOR DEVICE WITH AN OVERLAY MASK PATTERN

(71) Applicant: SAMSUNG ELECTRONICS CO., LTD., Suwon-si, Gyeonggi-Do (KR)

(72) Inventor: Jong-Su Kim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/184,315

(22) Filed: Jun. 16, 2016

(65) Prior Publication Data

US 2017/0125300 A1    May 4, 2017

Related U.S. Application Data

(60) Provisional application No. 62/247,243, filed on Oct. 28, 2015.

(51) Int. Cl.
| | |
|---|---|
| *H01L 21/8234* | (2006.01) |
| *H01L 21/02* | (2006.01) |
| *H01L 21/308* | (2006.01) |
| *H01L 21/311* | (2006.01) |
| *H01L 21/3105* | (2006.01) |
| *H01L 23/544* | (2006.01) |

(52) U.S. Cl.
CPC ........ *H01L 21/823431* (2013.01); *H01L 21/02532* (2013.01); *H01L 21/3081* (2013.01); *H01L 21/3086* (2013.01); *H01L 21/31051* (2013.01); *H01L 21/31111* (2013.01); *H01L 21/823437* (2013.01); *H01L 23/544* (2013.01); *H01L 2223/54426* (2013.01)

(58) Field of Classification Search
CPC ....... H01L 21/823431; H01L 21/02532; H01L 21/3081; H01L 21/3086; H01L 21/31051; H01L 21/823437; H01L 23/544; H01L 21/31111; H01L 2223/54426
See application file for complete search history.

(56) References Cited

U.S. PATENT DOCUMENTS

| | | | |
|---|---|---|---|
| 7,615,496 B2 | 11/2009 | Lee et al. | |
| 7,666,578 B2 | 2/2010 | Fischer et al. | |
| 8,178,442 B2 | 5/2012 | Park et al. | |

(Continued)

FOREIGN PATENT DOCUMENTS

| | | |
|---|---|---|
| KR | 1020090001078 | 1/2009 |
| KR | 1020090044409 | 5/2009 |
| KR | 100934831 | 12/2009 |

*Primary Examiner* — Selim Ahmed
(74) *Attorney, Agent, or Firm* — F. Chau & Associates, LLC

(57) ABSTRACT

The disclosure relates to methods of fabricating semiconductor devices. A method of fabricating a semiconductor device is provided as follows. A target layer is formed. A hard mask layer is formed on the target layer. The hard mask layer is patterned to form an overlay mask pattern including a first mask pattern and a plateau-shaped mask pattern. The first mask pattern encloses the plateau-shaped mask pattern. The first mask pattern is spaced apart from the plateau-shaped mask pattern. The target layer is patterned using the overlay mask pattern to form a redundant fin and a plateau-shaped overlay mark. The redundant fin is removed.

20 Claims, 55 Drawing Sheets

(56) References Cited

U.S. PATENT DOCUMENTS

| | | |
|---|---|---|
| 8,318,603 B2 | 11/2012 | Lee et al. |
| 8,389,413 B2 | 3/2013 | Ohuchi |
| 8,461,053 B2 | 6/2013 | Chen et al. |
| 8,518,831 B2 | 8/2013 | Hwang |
| 8,822,343 B2 | 9/2014 | Hsieh et al. |
| 9,379,017 B1* | 6/2016 | Sung |
| 2014/0065832 A1* | 3/2014 | Hsieh .................. G03F 7/70683 |
| | | 438/703 |
| 2014/0264631 A1 | 9/2014 | Wei et al. |
| 2016/0163810 A1* | 6/2016 | Huang .............. H01L 29/42392 |
| | | 257/329 |

\* cited by examiner

METHOD OF FABRICATING SEMICONDUCTOR DEVICE WITH AN OVERLAY MASK PATTERN

CROSS-REFERENCE TO RELATED APPLICATION

This application claims the benefit under 35 U.S.C. §119(e) to United States Provisional Patent Application No. 62/247,243, filed on Oct. 28, 2015 in the United States Patent & Trademark Office, the disclosure of which is incorporated by reference herein in its entirety.

TECHNICAL FEILD

Exemplary embodiments of the present inventive concept relate to methods of fabricating semiconductor devices.

DISCUSSION OF RELATED ART

Semiconductor devices are formed of a multi-layered structure. In the fabrication of the semiconductor devices, each layered structure is to be aligned to its previous layered structure. Each layered structure is formed using a photomask. Patterns of the photomask is transferred to a target layer to form a layered structure in the target layer. The layered structure is aligned to its previous layered structure using an overlay mark positioned within the previous layered structure.

If the photomask is not aligned properly due to poor image quality of the overlay mark, the layered structure fails to align correctly with its previous layered structure. This can result in device failure or low device performance. As the semiconductors continue to shrink in size, the requirements of high image quality of the overlay mark become more stringent.

SUMMARY

According to an exemplary embodiment of the present inventive concept, a method of fabricating a semiconductor device is provided as follows. A target layer is formed. A hard mask layer is formed on the target layer. The hard mask layer is patterned to form an overlay mask pattern including a first mask pattern and a plateau-shaped mask pattern. The first mask pattern encloses the plateau-shaped mask pattern. The first mask pattern is spaced apart from the plateau-shaped mask pattern. The target layer is patterned using the overlay mask pattern to form a redundant fin and a plateau-shaped overlay mark. The redundant fin is removed.

According to an exemplary embodiment of the present inventive concept, a method of forming a semiconductor device is provided as follows. A target layer to be patterned to be a plateau-shaped overlay mark and a plurality of active fins is formed. A hard mask layer is formed on the target layer. A silicon layer is formed on the hard mask layer. The silicon layer is patterned to form a plurality of line-shaped silicon patterns and a first ring-shaped silicon pattern and a second ring-shaped silicon pattern. The line-shaped silicon patterns are spaced apart from each other at a first distance and the first ring-shaped silicon pattern is spaced apart from the second ring-shaped silicon pattern at a second distance smaller than the first distance. An oxide layer is formed on the line-shaped silicon patterns, the first ring-shaped silicon pattern and the second ring-shaped silicon pattern so that the oxide layer completely fills a gap between the first-ring shaped silicon pattern and the second ring-shaped silicon pattern. An anisotropic etching process is performed on the oxide layer to form a plurality of line-shaped oxide patterns and a first ring-shaped oxide pattern, a second ring-shaped oxide pattern and a third ring-shaped oxide pattern. The line-shaped oxide patterns are formed on sidewalls of the line-shaped silicon patterns. The first ring-shaped oxide pattern is formed on an outer sidewall of the first ring-shaped silicon pattern. The second ring-shaped oxide pattern is formed between an inner sidewall of the first ring-shaped silicon pattern and an outer sidewall of the second ring-shaped silicon pattern and completely fills the gap between the first ring-shaped silicon pattern and the second ring-shaped silicon pattern. The third ring-shaped oxide pattern is formed on an inner sidewall of the second ring-shaped silicon pattern. The line-shaped silicon patterns, the first ring-shaped silicon pattern and the second ring-shaped silicon pattern are removed. An organic planarizing layer (OPL) is formed so that a sidewall of the OPL is positioned on an upper surface of the second ring-shaped oxide pattern. The OPL has a first thickness. The hard mask layer is patterned to form a plurality of line-shaped mask patterns and to form a plateau-shaped mask pattern using the line-shaped oxide patterns and a combined structure of the OPL and the second ring-shaped oxide pattern, respectively. The target layer is patterned using the line-shaped mask patterns and the plateau-shaped mask pattern so that the active fins are formed under the line-shaped mask patterns and the plateau-shaped overlay mark are formed under the combined structure of the OPL and the second ring-shaped oxide pattern.

According to an exemplary embodiment of the present inventive concept, a method of forming a semiconductor device is provided as follows. A target layer is formed on a substrate. The target layer has a device region and an overlay mark region. The device region and the overlay mark region are etched to form a plurality of active fins and form a plateau-shaped overlay mark, respectively. A metal layer is formed on the active fins. A photomask is aligned to the active fins using the plateau-shaped overlay mark. The photomask is used to pattern the metal layer to form a plurality of gate electrodes.

BRIEF DESCRIPTION OF DRAWINGS

These and other features of the inventive concept will become more apparent by describing in detail exemplary embodiments thereof with reference to the accompanying drawings of which:

FIGS. 8A to 10A show planar views of the device region and the overlay mark region according to an exemplary embodiment of the present inventive concept;

FIGS. 8B to 10B show cross-sectional views of the device region and the overlay mark region, taken along line X-X' of FIGS. 8A to 10A, according to an exemplary embodiment of the present inventive concept;

FIGS. 13A to 17A show planar views of the device region and the overlay mark region according to an exemplary embodiment of the present inventive concept;

FIGS. 13B to 17B show cross-sectional views of the device region and the overlay mark region, taken along line X-X' of FIGS. 13A to 17A, according to an exemplary embodiment of the present inventive concept;

FIGS. 25A to 28A show planar views of a device region and an overlay mark region according to an exemplary embodiment of the present inventive concept;

FIGS. 25B to 28B show cross-sectional views of a device region and an overlay mark region, taken along line X-X' of FIGS. 25A to 28A, according to an exemplary embodiment of the present inventive concept;

FIGS. 31A to 34A show planar views of the device region and the overlay mark region according to an exemplary embodiment of the present inventive concept;

FIGS. 31B to 34B show cross-sectional views of the device region and the overlay mark region, taken along line X-X' of FIGS. 31A to 34A, according to an exemplary embodiment of the present inventive concept;

Figure 1:
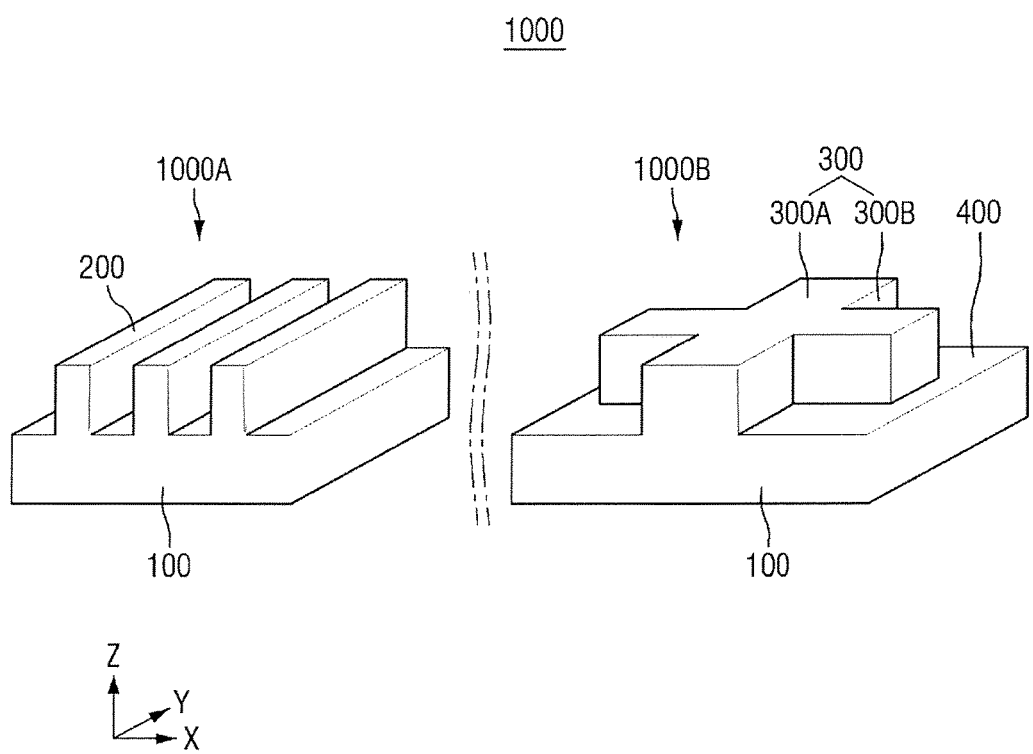
FIG. 1 shows a perspective view of a device region and an overlay mark region of a semiconductor device according to an exemplary embodiment of the present inventive concept.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the figures to indicate corresponding or analogous elements.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present.

FIG. 1 shows a perspective view of a device region and an overlay mark region of a semiconductor device according to an exemplary embodiment of the present inventive concept. The semiconductor device 1000 includes a substrate 100 having a device region 1000A and an overlay mark region 1000B.

The device region 1000A includes an active element such as a transistor of which an active region is formed in a fin-type structure 200. In an exemplary embodiment, the transistor is formed of a fin-type field effect transistor (FinFET). Fin-type structures 200 are arranged in a first direction (x-axis) and are spaced apart from each other. The fin-type structures 200 are extended in parallel along a second direction (y-axis). Each fin-type structure 200 is protruded toward a third direction (z-axis) from the substrate 100. In an exemplary embodiment, the fin-type structure 200 may be epitaxially grown from the substrate 100. In an exemplary embodiment, the fin-type structure 200 may be formed by etching the substrate 100.

The overlay mark region 1000B includes an overlay mark 300 which serves to provide a reference for aligning subsequent patterns to target patterns including the fin type structure 200, for example. The overlay mark 300 may have a high-precision image feature and be located such that the overlay mark 300 does not affect subsequent wafer processing processes or device performances. In an exemplary embodiment, the target patterns may be the fin-type structures 200, and the subsequent patterns may be gate electrodes.

The overlay mark 300, extended along the third direction, includes a flat upper surface 300A and an edge boundary 300B. The flat upper surface 300A fills a region defined by the edge boundary 300B. The flat upper surface 300A is continuously extended up to an edge boundary 300B which defines the shape of overlay mark 300. The edge boundary 300B is continuous and closed. In an exemplary embodiment, an photolithography equipment may detect the edge boundary 300B to locate and identify the overlay mark using, for example, a contrast difference between the flat upper surface 300A and an outer region 400.

The overlay mark 300 has a crosshair shape when viewed along the third direction. The present inventive concept is not limited thereto, and the overlay mark 300 may have various shapes. Hereinafter, the overlay mark 300 may be referred to as a plateau-shaped overlay mark.

In an exemplary embodiment, two or more fin-type structures may be patterned within the edge boundary 300B. In this case, the edge boundary 300B need not be continuous and need not have the flat upper surface 300A. For example, the edge boundary 300B may be broken and the upper surface of the overlay mark need not be continuous. The overlay mark having fin-type structures within the edge boundary 300B, which may be referred to as an overlay fin mark, may provide less contrast difference compared to the plateau-shaped overlay mark.

Figure 2:
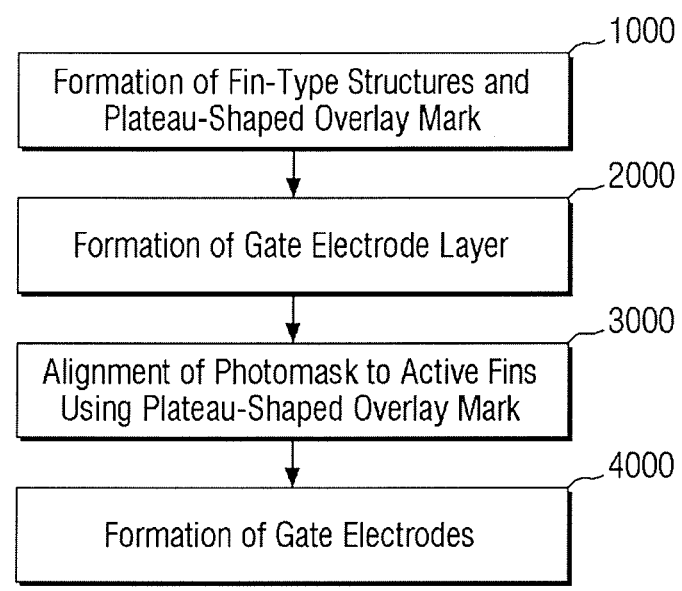
FIG. 2 is a flowchart of fabricating a device region and an overlay mark region according to an exemplary embodiment of the present inventive concept.
Figure 3:
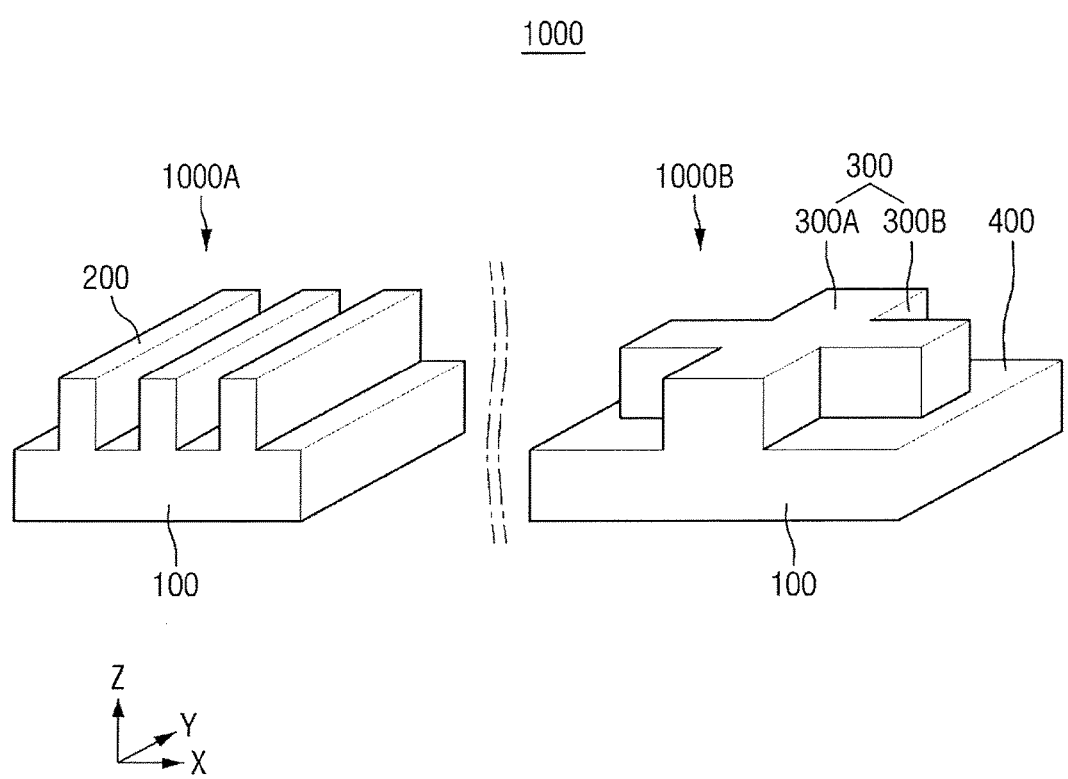
FIGS. 3 to 5 show perspective views of the device region and the overlay mark region according to an exemplary embodiment of the present inventive concept.
Figure 4:
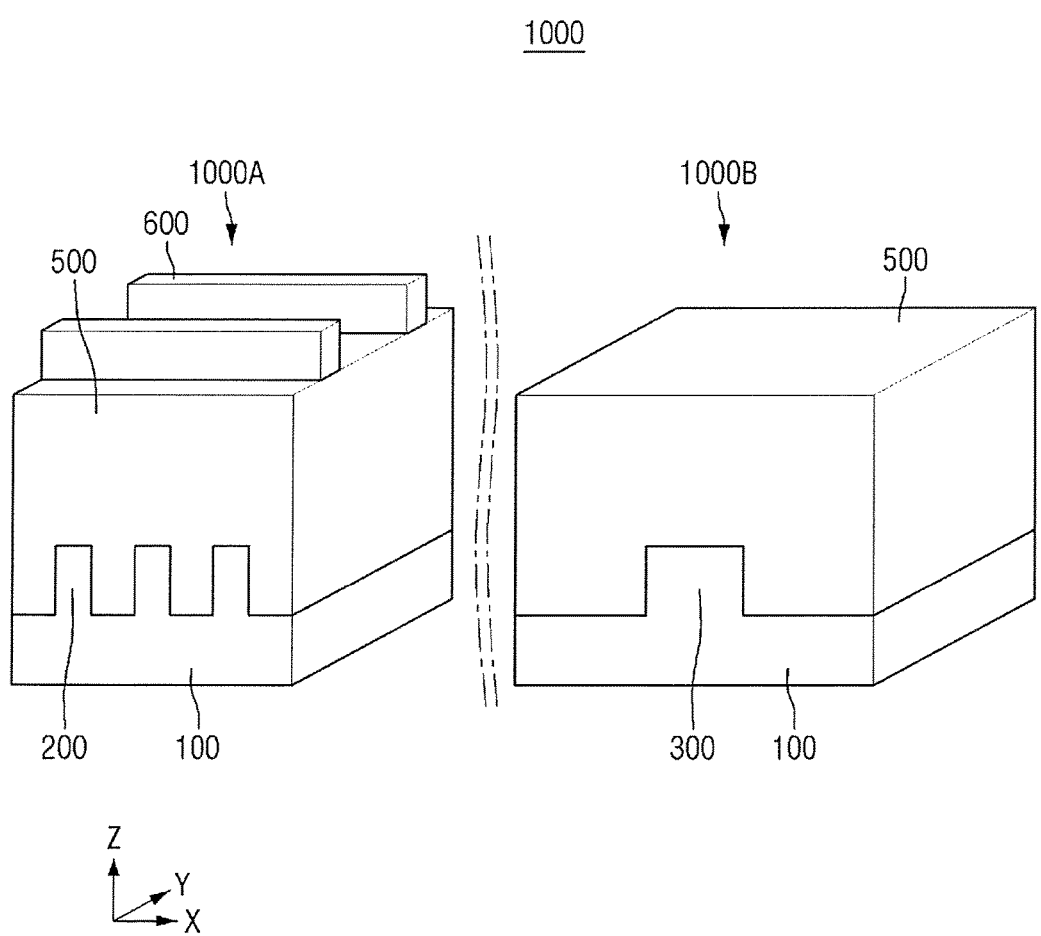
Figure 5:
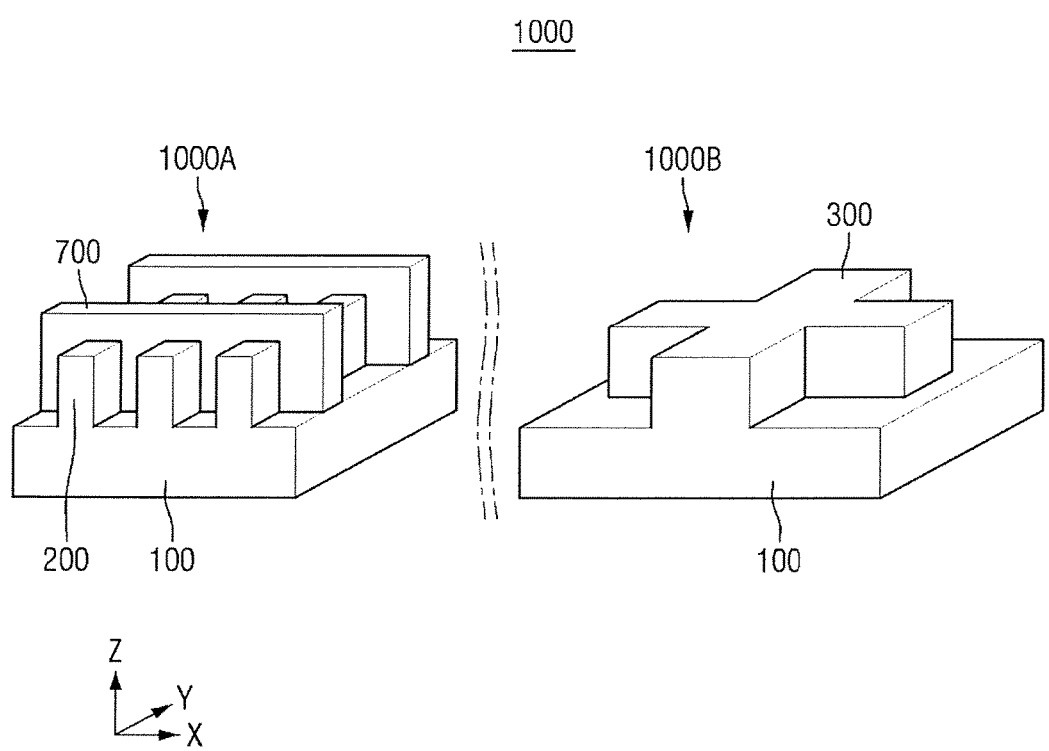

With reference to FIGS. 2 to 5, it will be described the usage of the overlay mark 300 in the fabrication of FinFETs. FIG. 2 is a flowchart of fabricating a device region and an overlay mark region according to an exemplary embodiment of the present inventive concept. FIGS. 3 to 5 show perspective views of the device region 1000A and the overlay mark region 1000B according to an exemplary embodiment of the present inventive concept. According to an exemplary embodiment, a plateau-shaped overlay mark is used to align a photomask so that gate electrodes of FinFETs are formed on fin-type structures. The fin-type structures may provide channel regions of FinFETs. The plateau-shaped overlay mark may be formed using process steps for forming the fin-type structures.

FIG. 3 shows fin-type structures 200 and a plateau-shaped overlay mark 300 formed after performing step 1000 of FIG. 2.

In step 1000, a target layer 100 is fabricated to have the plateau-shaped overlay mark 300 and the fin-type structures 200. The target layer 100 may include a substrate, an epitaxially-grown silicon layer, or an epitaxially grown SiGe alloy layer. The substrate may be formed of silicon. For the convenience of descriptions, the target layer 100 is assumed to be a substrate. The plateau-shaped overlay mark 300 and the fin-type structures 200 may be simultaneously formed using a photomask (not shown here) from the substrate.

The fin-type structures 200 are formed on a device region 1000A of the substrate 100, and the plateau-shaped overlay mark 300 is formed on an overlay mark region 1000B of the substrate 100. The plateau-shaped overlay mark 300 is protruded along a third direction (z-axis) from an outer region 400 in the overlay mark region 1000B. The plateau-shaped overlay mark 300 includes a flat upper surface 300A and an edge boundary 300B. The flat upper surface 300A is plateau-shaped, and fills a region defined by the edge boundary 300B. In this case, the outer region 400 is an upper surface of the target layer 100.

FIG. 4 shows a gate electrode layer 500 formed after performing step 2000 of FIG. 2. In step 2000, the gate electrode layer 500 is formed on the resulting structure of FIG. 3. For example, the gate electrode layer 500 is formed on the fin-type structures 200 in the device region 1000A and the plateau-shaped overlay mark 300 in the overlay mark region 1000B.

Etch mask patterns 600 are formed on the gate electrode layer 500 in the device region 1000A. In step 3000, a photolithography process may be performed to form the etch mask patterns 600 on the gate electrode layer 500. In the photolithography process, a photoresist layer (not shown here) is formed on the gate electrode layer 500, and a photomask is aligned to the fin-type structures 200 using the plateau-shaped overlay mark 300 so that patterns of the photomask are transferred to form the etch mask patterns 600. The present inventive concept is not limited thereto. For example, the etch mask patterns 600 may be formed of a hard mask material including silicon nitride, silicon oxide or amorphous silicon.

The plateau-shaped overlay mark 300 may provide a reliable overlay mark for a subsequent process compared with an overlay fin mark formed of multiple overlay fin-type structures. In an exemplary embodiment, the plateau-shaped overlay mark 300 provides an edge boundary 300B having an increased contrast difference compared with an overlay fin mark having multiple overlay fin-type structures. The overlay fin-type structure may be similar to, in profile or shape, a fin-type structure formed in the device region 1000A.

FIG. 5 shows gate electrodes 700 formed after performing step 4000 of FIG. 3. In step 4000, the gate electrode layer 500 is patterned to the gate electrodes 700 using the etch mask patterns 600 as an etch mask. The gate electrodes 700 are formed using an etching process in which the gate electrode layer 500 exposed through the etch mask patterns 600 may be removed to form the gate electrodes 700.

In an exemplary embodiment, the gate electrodes 700 are extended in parallel to the first direction (x-axis), and the fin-type structures 200 are extended in parallel to the second direction (y-axis) crossing the first direction. The overlapped regions of the fin type structures 200 with the gate electrodes 700 may serve as channels of FinFETs.

If the plateau-shaped overlay mark 300 has poor contrast in a photolithography process of patterning the etch mask patterns 600 for forming the gate electrodes 700, the gate electrodes 700 may be misaligned to the extent that FinFETs including the gate electrodes 700 and the fin-type structures 200 may fail to operate or have low performance. As described above, the plateau-shaped overlay mark 300 provides a flat surface within an edge boundary, and thus has a reliable contrast in the formation of FinFETs.

A gate oxide layer (not shown here) may be interposed between the gate electrodes 700 and the fin-type structures 200. The gate oxide layer may be formed of silicon oxide or a high-k dielectric material of which a dielectric constant is greater than a dielectric constant of silicon oxide. The gate electrodes 700 are formed of doped silicon, metal or a combination thereof. In an exemplary embodiment, a combination of metal gate electrodes and a high-k dielectric gate oxide may be used for FinFETs.

Hereinafter, the formation of the plateau-shaped overlay mark 300 will be described with reference to a flowchart and a cross-sectional view of a structure formed according to the flowchart.

Figure 6:
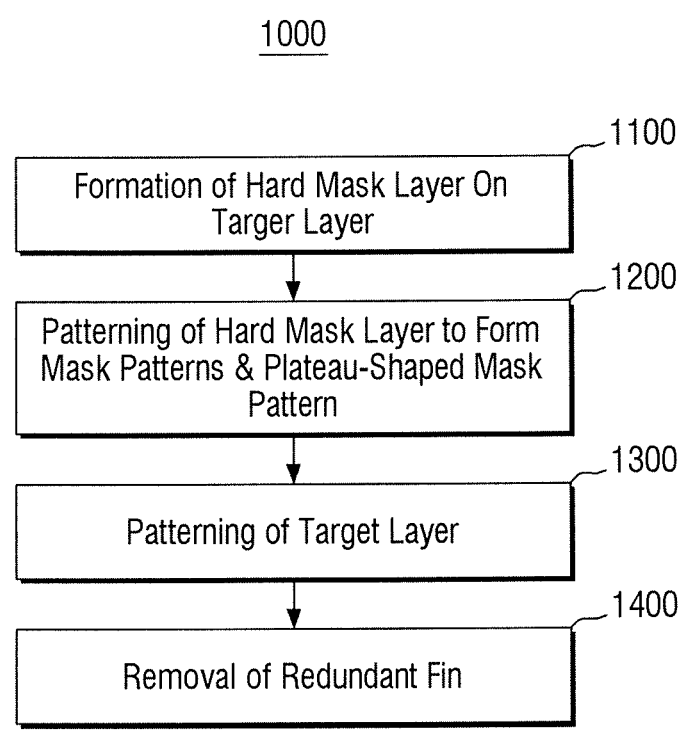
FIG. 6 shows a flowchart of forming a plateau-shaped overlay mark in the process of fabricating fin-type structures of FinFETs according to an exemplary embodiment of the present inventive concept.
Figure 7:
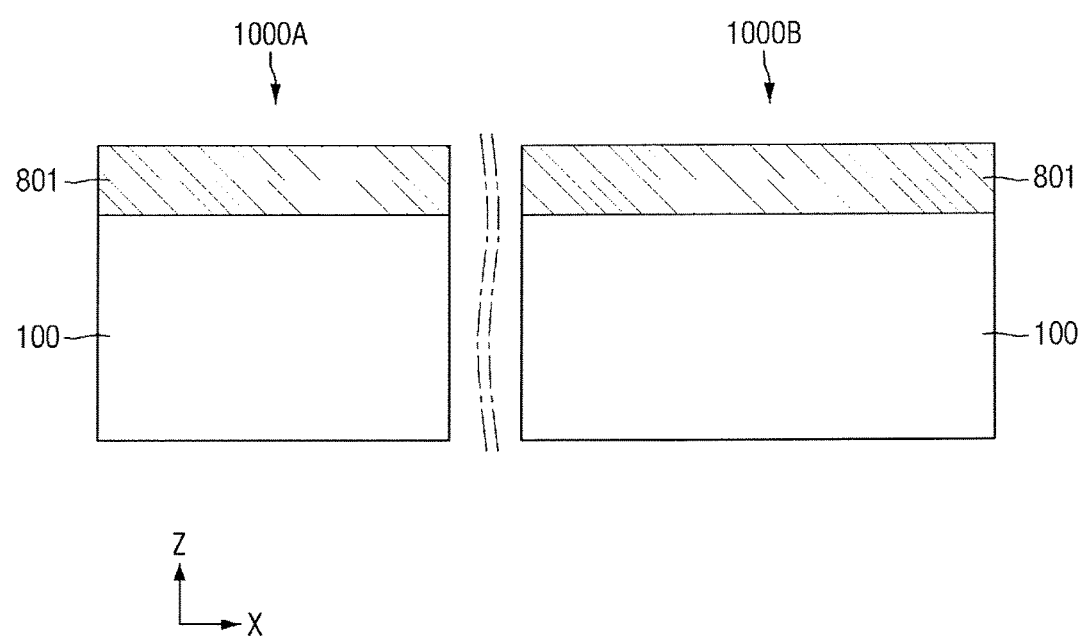
FIG. 7 shows a cross-sectional view of a device region and an overlay mark region according to an exemplary embodiment of the present inventive concept.

With reference to FIGS. 6, 7, 8A to 10A and 8B to 10B, the formation of an overlay mark will be described. FIG. 6 shows a flowchart of forming a plateau-shaped overlay mark in the process of fabricating fin-type structures of FinFETs according to an exemplary embodiment of the present inventive concept. FIG. 7 shows a cross-sectional view of a device region and an overlay mark region according to an exemplary embodiment of the present inventive concept. FIGS. 8A to 10A show planar views of the device region and the overlay mark region according to an exemplary embodiment of the present inventive concept. FIGS. 8B to 10B show cross-sectional views of the device region and the overlay mark region, taken along line X-X' of FIGS. 8A to 10A, according to an exemplary embodiment of the present inventive concept.

FIG. 7 shows a hard mask layer 801 formed after performing step 1100 of FIG. 6. In an exemplary embodiment, the hard mask layer 801 may be formed of silicon nitride. The present inventive concept is not limited thereto.

The hard mask layer 801 is formed on a target layer 100. In an exemplary embodiment, the target layer 100 may be an epitaxially grown silicon layer or an epitaxially grown SiGe alloy layer. For the convenience of description, the target layer is assumed to be an epitaxially grown silicon layer.

The target layer 100 includes a device region 1000A and an overlay mark region 1000B. The device region 1000A is a region where fin-type structures of FinFETs are to be formed; the overlay mark region 1000B is a region where a plateau-shaped overlay mark is to be formed.

Figure 8A:
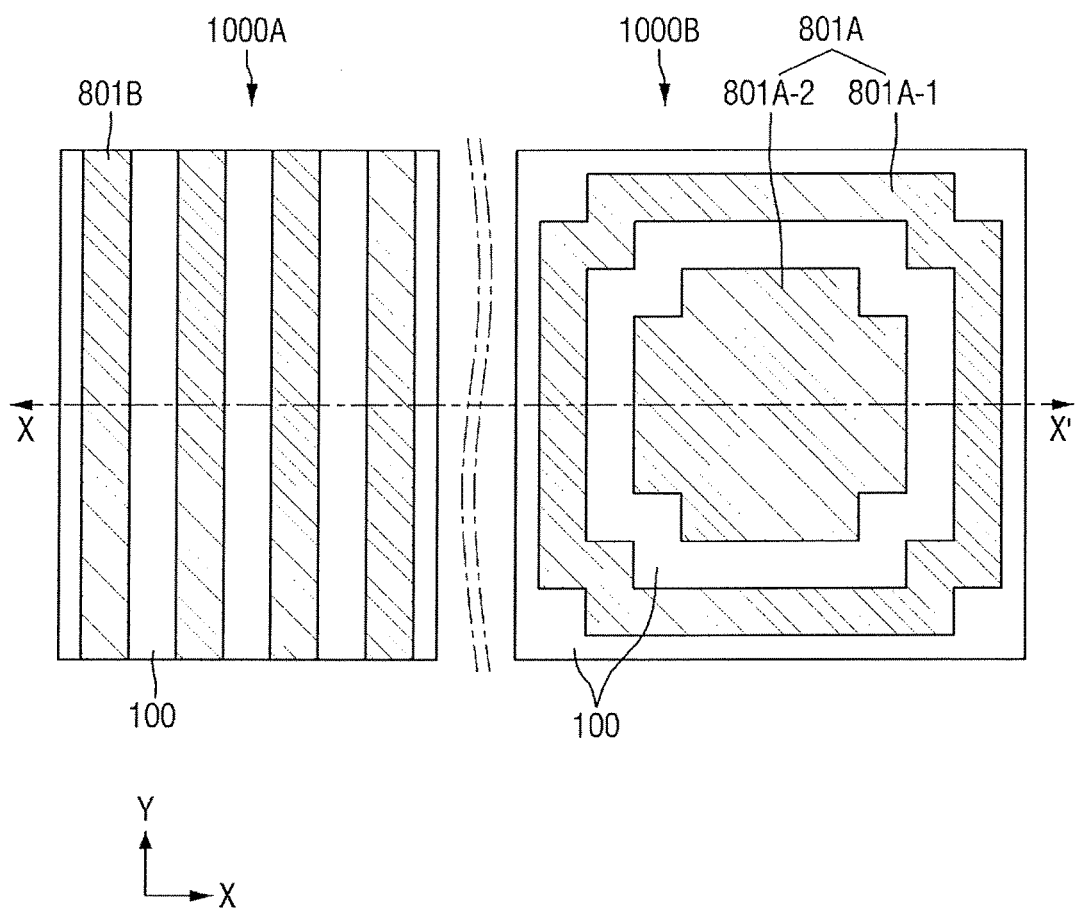
Figure 8B:
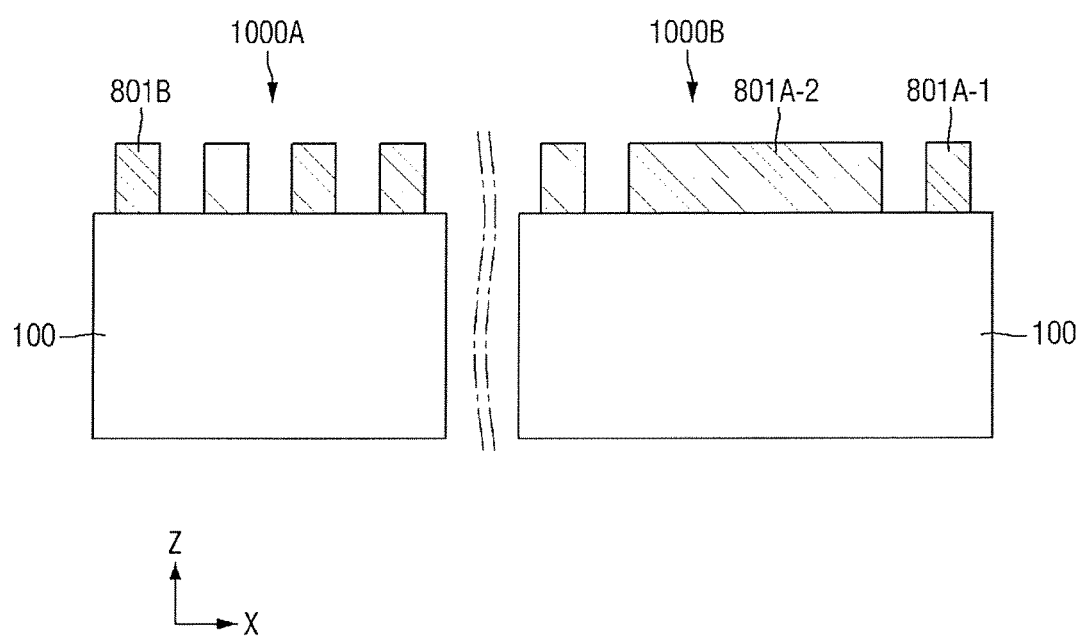

FIGS. 8A and 8B show hard mask patterns 801B and an overlay mask pattern 801A formed after performing step 1200 of FIG. 6 according to an exemplary embodiment of the present inventive concept. FIG. 8A is a planar view of the hard mask patterns 801B and the overlay mask pattern 801A, and FIG. 8B is a cross-sectional view taken along line X-X' of FIG. 8A. For the convenience of description, one overlay mask pattern 801A is shown in FIGS. 8A and 8B. In an exemplary embodiment, at least two overlay mask patterns may be formed to form at least two overlay marks spaced apart from each other.

The hard mask layer 801 is patterned using an etching process into the hard mask patterns 801B in the device region 1000A and the overlay mask pattern 801A in the overlay mark region 1000B.

The hard mask patterns 801B is used for patterning the target layer 100 to form the fin-type structures 200 of FIG. 3, for example. The hard mask patterns 801B is extended in parallel to the second direction (y-axis).

The overlay mask pattern 801A is used for patterning the plateau-shaped overlay mark 300 of FIG. 3, for example. The overlay mask pattern 801A includes a first overlay mask pattern 801A-1 and a second overlay mask pattern 801A-2. The first overlay mask pattern 801A-1 is ring-type shaped. For example, the first overlay mask pattern 801A-1 is symmetric with respect to the center, and is a continuous and closed loop. At the center of the first overlay mask pattern 801A-1, the second overlay mask pattern 801A-2 is formed having a cross-hair shaped. In an exemplary embodiment, the first overlay mask pattern 801A-1 and the second overlay mask pattern 801A-2 are concentric. The formation of the overlay mask pattern 801A will be described with reference to FIG. 11.

Figure 9A:
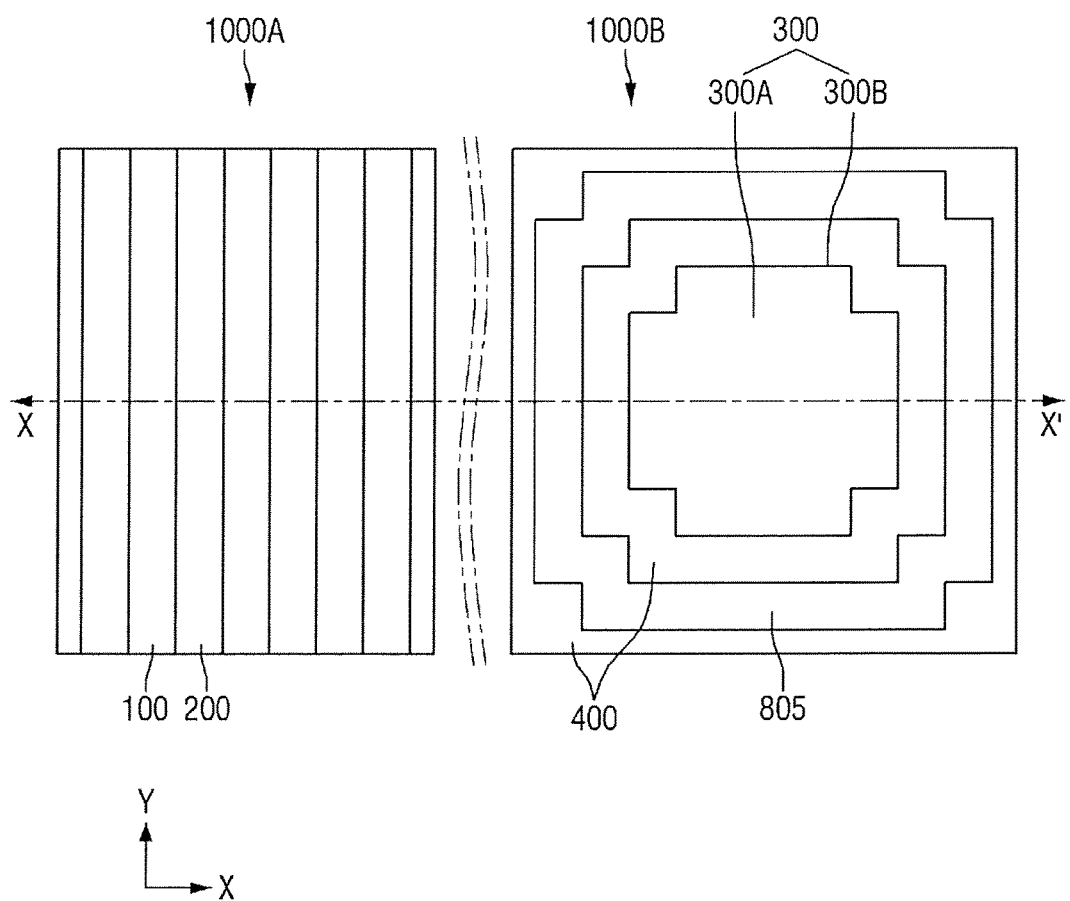
Figure 9B:
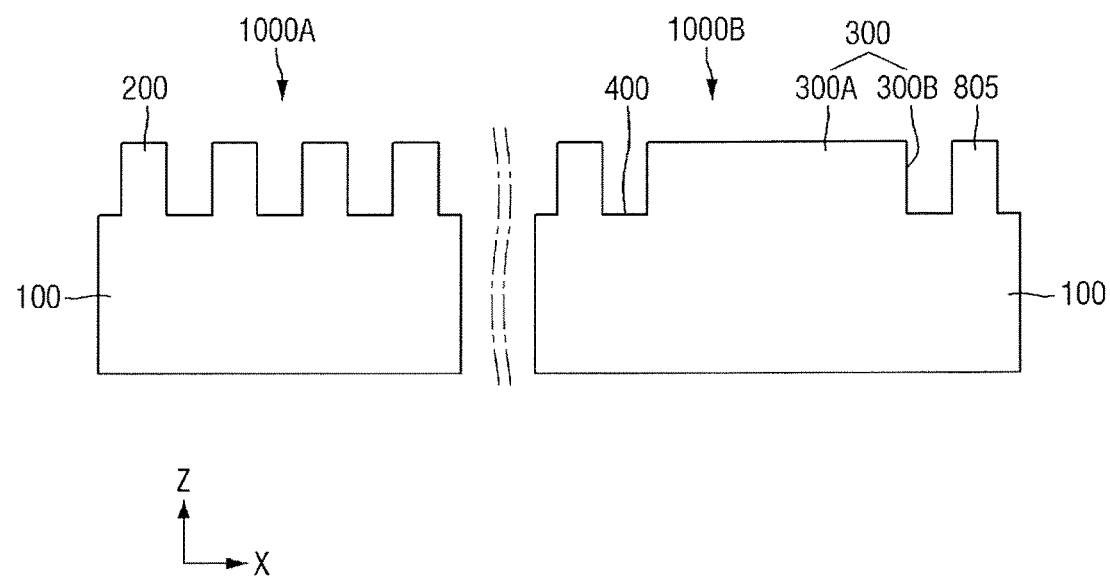

FIGS. 9A and 9B show fin-type structures 200 and an plateau-shaped overlay mark 300 formed in the device region 1000A and the overlay mark region 1000B, respectively, after performing step 1300 of FIG. 6. The target layer 100 is patterned by an etching process using the mask patterns 801B of FIGS. 8A and 8B and the overlay mask pattern 801A of FIGS. 8A and 8B, as etching mask patterns to form the fin-type structures 200 and the plateau-shaped overlay mark 300. In an exemplary embodiment, the fin-type structures 200 and the plateau-shaped overlay mark 300 may be formed using the same etching process. In this case, the fin-type structures 200 and the plateau-shaped overlay mark 300 may be formed at substantially the same. In the formation of the plateau-shaped overlay mark 300, a redundant fin-type structure 805 is formed in the overlay mark region 1000B. The redundant fin-type structure 805 may reduce a contrast difference between the overlay mark 300 and the outer region 400 of the target layer 100. The redundant fin-type structure 805, if remains in the overlay mark region 1000B, may prevent the edge boundary 300B of the plateau-shaped overlay mark 300 from being detected in a photolithography process. Accordingly, the redundant fin-type structure 805 may be removed in a subsequent process.

Figure 10A:
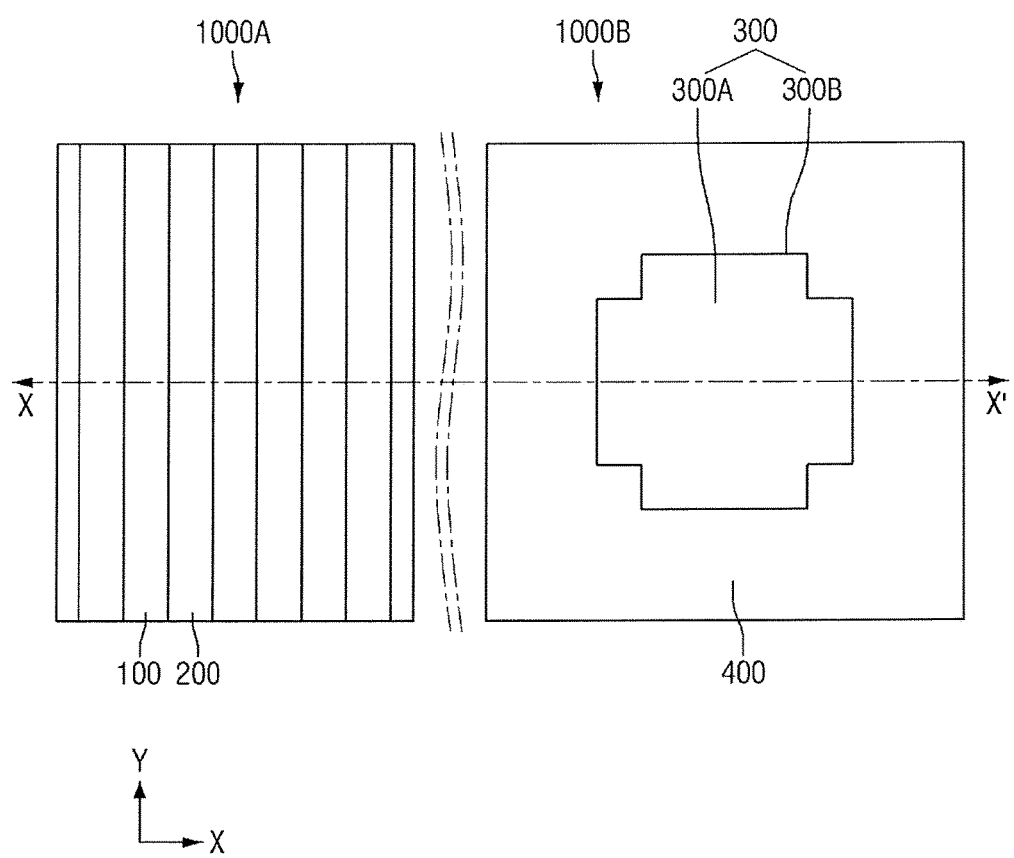
Figure 10B:
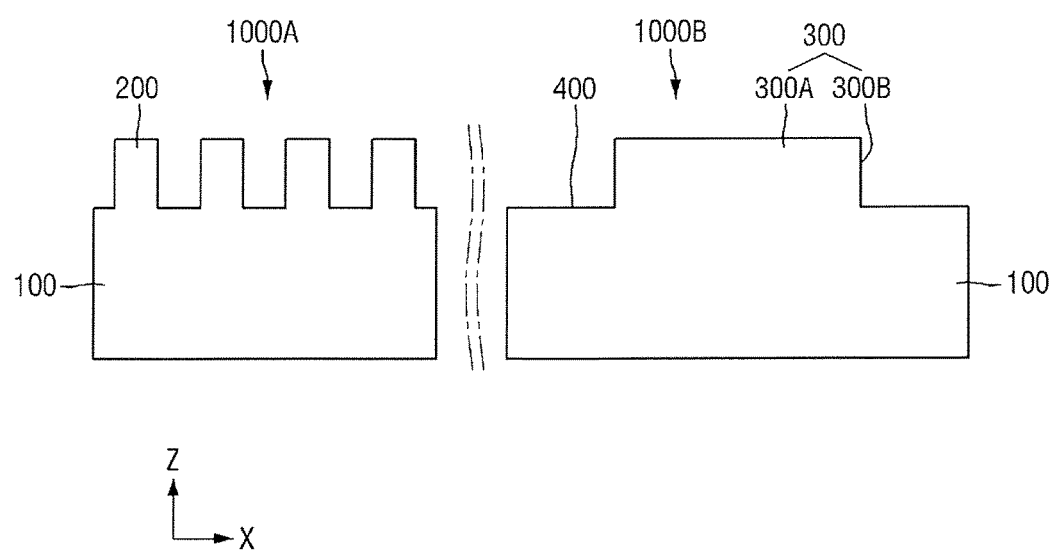

FIGS. 10A and 10B show removal of the redundant fin-type structure 805 after step 1400 of FIG. 6. The redundant fin-type structure 805 of FIGS. 9A and 9B is removed from the overlay mark region 1000B. In an exemplary embodiment, the overlay mark region 1000B may include the plateau-shaped overlay mark 300 and an outer region 400 adjacent to the plateau-shaped overlay mark 300, and a photolithography equipment compares contrasts between the outer region 400 and the plateau-shaped overlay mark 300 to detect the edge boundary 300B of the plateau-shaped overlay mark 300. In an exemplary embodiment, the outer region 400 adjacent to the plateau-shaped overlay mark 300 does not have the redundant fin-type structure 805. In the device region 1000A, the fin-type structures 200 are formed.

Figure 11:
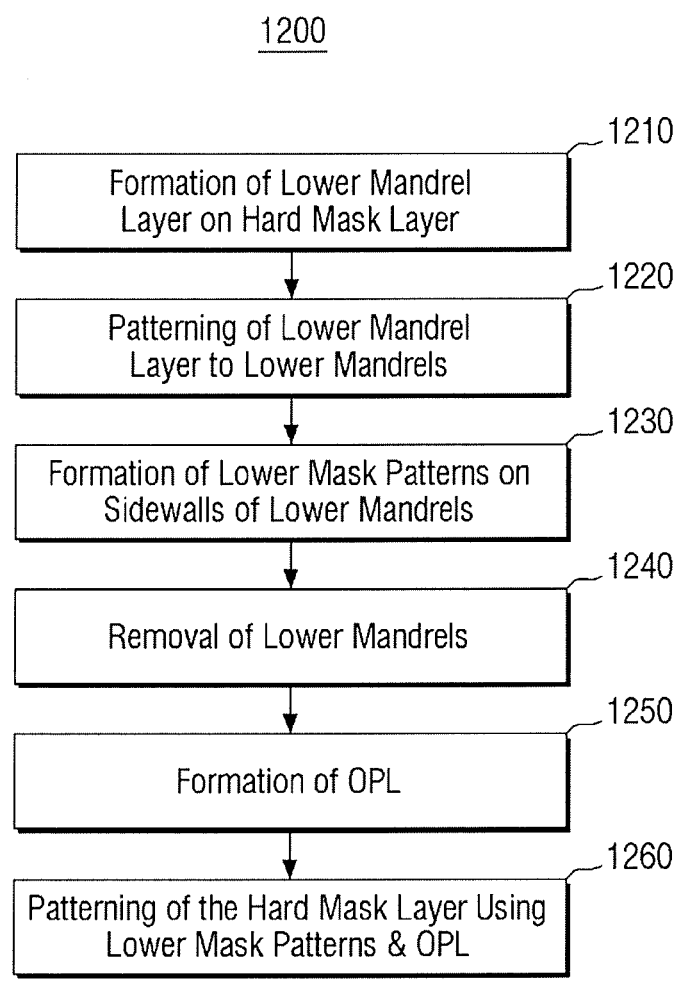
FIG. 11 shows a flowchart of patterning a hard mask layer to form mask patterns and a plateau-shaped mask pattern of step 1200 of FIG. 6 according to an exemplary embodiment of the present inventive concept.
Figure 12:
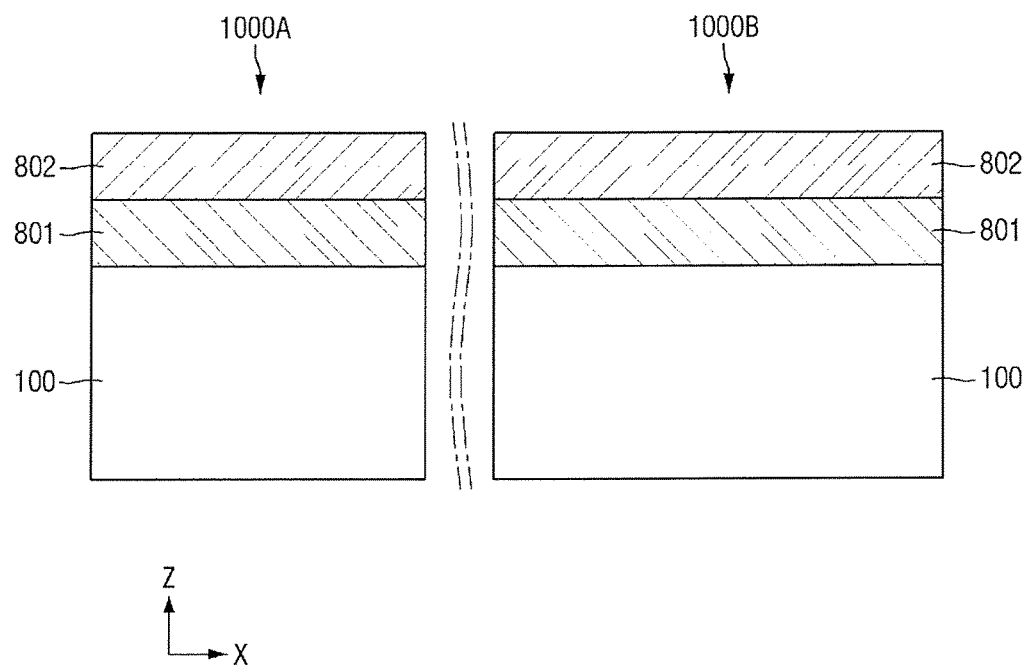
FIG. 12 shows a cross-sectional view of a device region and an overlay mark region according to an exemplary embodiment of the present inventive concept.

Hereinafter, the patterning of the hard mask layer 801 (step 1200 of FIG. 6) will be described with reference to FIGS. 11, 12, 13A and 13B, 14A-14C, 15A and 15B, 16A and 16B, and 17A and 17B. FIG. 11 shows a flowchart of patterning a hard mask layer to form mask patterns and a plateau-shaped mask pattern of step 1200 of FIG. 6 according to an exemplary embodiment of the present inventive concept. FIG. 12 shows a cross-sectional view of a device region and an overlay mark region according to an exemplary embodiment of the present inventive concept. FIGS. 13A to 17A show planar views of the device region and the overlay mark region according to an exemplary embodiment of the present inventive concept. FIGS. 13B to 17B show cross-sectional views of the device region and the overlay mark region, taken along line X-X' of FIGS. 13A to 17A, according to an exemplary embodiment of the present inventive concept. FIG. 14C shows a preliminary lower mandrel layer conformally formed on the resulting structure of FIGS. 13A and 13B according to an exemplary embodiment of the present inventive concept.

FIG. 12 shows a cross-sectional view of a device region 1000A and an overlay mark region 1000B according to an exemplary embodiment of the present inventive concept. FIGS. 13A to 17A show planar views of the device region 1000A and the overlay mark region 1000B according to an exemplary embodiment of the present inventive concept. FIGS. 13B to 17B show cross-sectional views of the device region 1000A and the overlay mark region 1000B, taken along line X-X' of FIGS. 13A to 17A, according to an exemplary embodiment of the present inventive concept.

FIG. 12 shows a lower mandrel layer 802 formed after performing step 1210 of FIG. 11 according to an exemplary embodiment of the present inventive concept. The lower mandrel layer 802 is formed on the resulting structure of FIG. 7. In step 1210, the lower mandrel layer 802 is formed on the hard mask layer 801. The lower mandrel layer 802 may be a material having etch selectivity with respect to the hard mask layer 801. For example, the hard mask layer 801 may be formed of silicon nitride, and the lower mandrel layer 802 is formed of silicon.

Figure 13A:
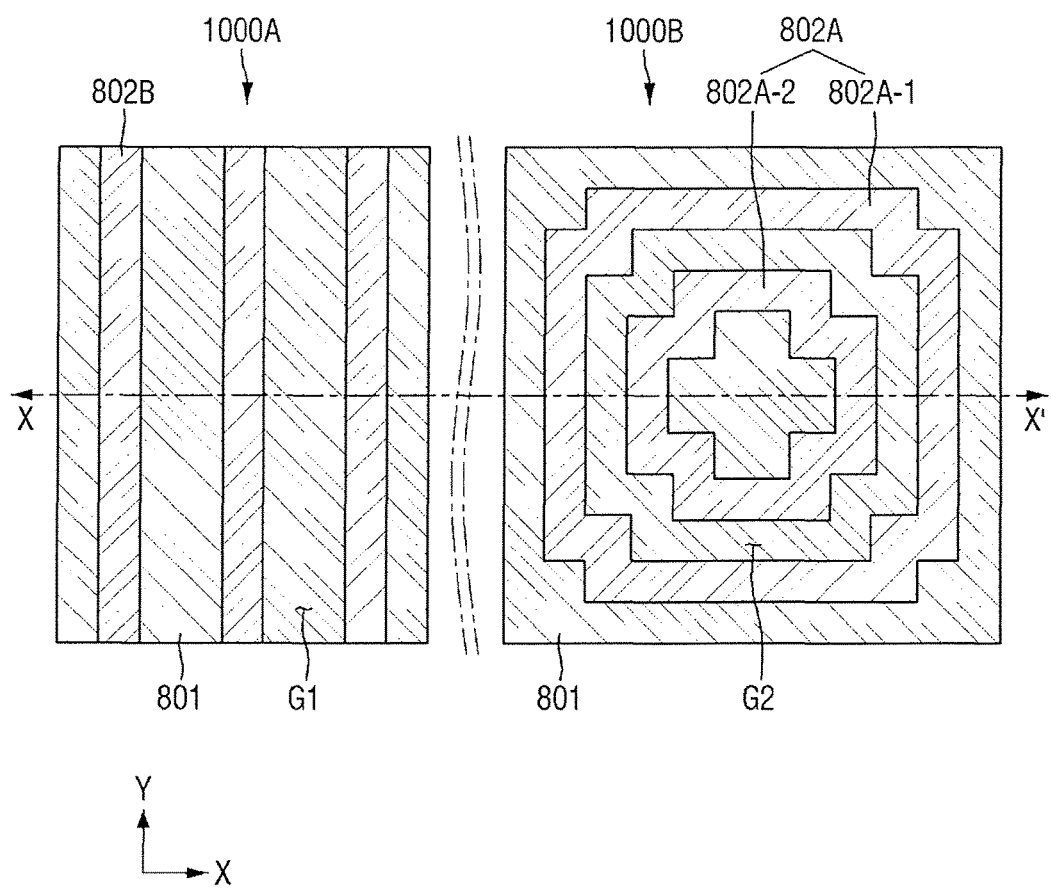
Figure 13B:
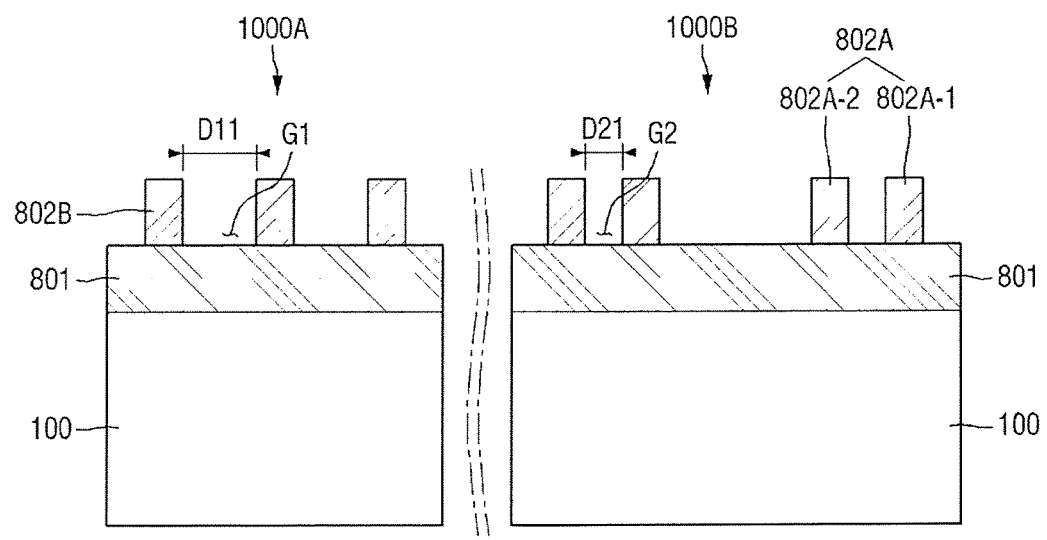

FIGS. 13A and 13B show lower mandrels 802A and 802B formed after performing step 1220 of FIG. 12 according to an exemplary embodiment of the present inventive concept. In step 1220, the lower mandrel layer 802 is patterned into the lower mandrels 802A and 802B using an etching process. In the device region 1000A, the lower mandrels 802B are extended in parallel along the second direction (y-axis), and the lower mandrels 802B are spaced apart from each other at a first distance D11. In the overlay mark region 1000B, the lower mandrel 802A includes a first lower mandrel 802A-1 and a second lower mandrel 802A-2. The first lower mandrel 802A-1 and the second lower mandrel 802A-2 are spaced apart from each other at a second distance D21 smaller than the first distance D11. The first and the second lower mandrels 802A-1 and 802A-2 are closed patterns and concentric. The second lower mandrel 802A-2 is positioned within the first lower mandrel 802A-1.

In an exemplary embodiment, the first distance D11 and the second distance D21 are predetermined such that a preliminary lower mask layer 803 need not touch in a first gap 01 having the first distance D11 and fills a second gap G2 having the second distance D21 as shown in FIG. 14C. The preliminary lower mask layer 803 will be described with reference to FIG. 14C.

Figure 14A:
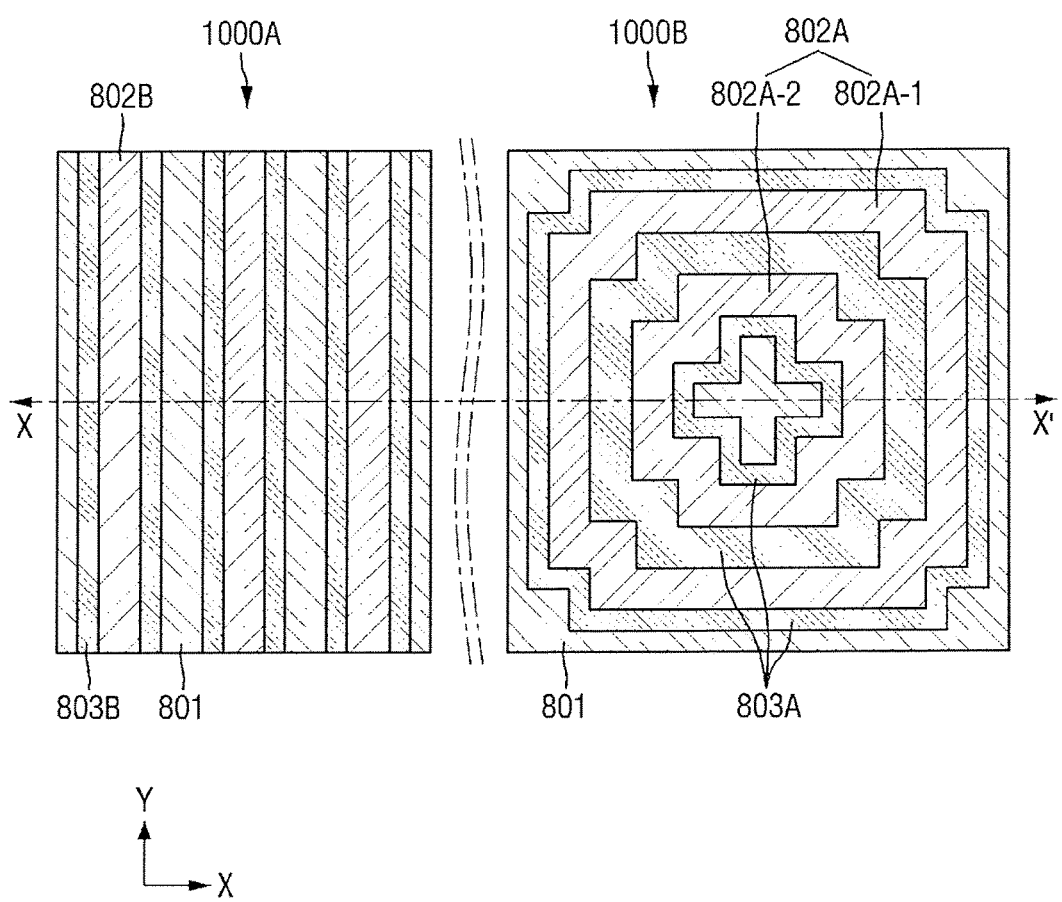
Figure 14B:
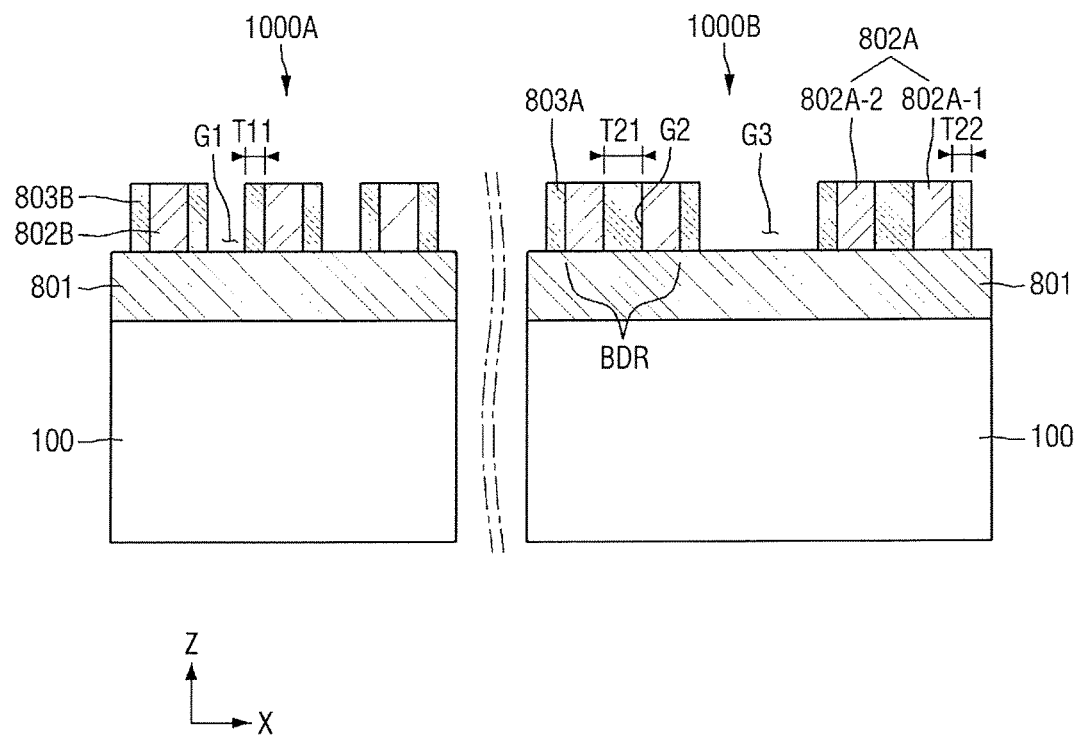
Figure 14C:
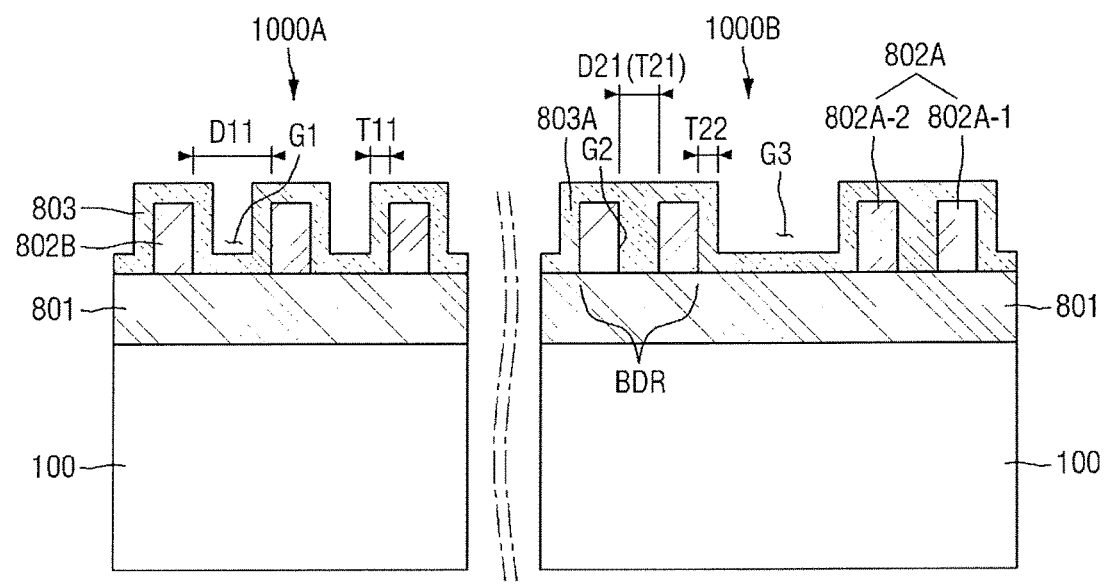
FIG. 14C shows a preliminary lower mask layer conformally formed on the resulting structure of FIGS. 13A and 13B according to an exemplary embodiment of the present inventive concept.

FIGS. 14A and 14B show lower mask patterns 803A and 803B formed after performing step 1230 of FIG. 11 according to an exemplary embodiment of the present inventive concept. In step 1230, the lower mask patterns 803A and 803B are formed on sidewalls of the lower mandrels 802A and 802B. The lower mask patterns 803B are formed at a first thickness T11 on sidewalls of the lower mandrels 802B in the device region 1000A. The lower mask patterns 803A of the overlay mark region 1000B have two thicknesses T21 and T22. For example, the lower mask pattern 803A has a second thickness T21 and a third thickness T22. The lower mask patterns 803A formed between the first lower mandrel 802A-1 and the second lower mandrel 802A-2 have the second thickness T21. The lower mask patterns 803A formed on an outer sidewall of the first lower mandrel 802A-1 and on an inner sidewall of the second lower mandrel 802A-2 have the third thickness T22. In an exemplary embodiment, the third thickness T22 is substantially the same with the first thickness T11, and is smaller than the second thickness T21. In an exemplary embodiment, the lower mask pattern 803B may have the thickness T11 which is insufficient to fill the first gap G1 between two adjacent lower mandrels 802B in the device region 1000A. In an exemplary embodiment, the lower mask pattern 803A may have the thickness T22 which is insufficient to fill a third gap G3 formed within the second lower mandrel 802A-2. For example, the third gap G3 is defined by the inner sidewall of the second lower mandrel 802A-2. In an exemplary embodiment, the lower mask patterns 803A are merged to have the second thickness T21 in the second gap G2. A region having the second gap G2, the first lower mandrel 802A-1 and the second lower mandrel 802A-2 may be referred to as a boundary define region BDR of the overlay mark region 1000B. In an exemplary embodiment, the second thickness T21 may be about two times the third thickness T22 or may be less than about two times the third thickness and greater than the third thickness T22.

FIG. 14C shows a preliminary lower mask layer 803 conformally formed on the resulting structure of FIGS. 13A and 13B according to an exemplary embodiment of the present inventive concept. The thickness of the preliminary lower mask layer T11 and T22 is such that the preliminary lower mask layer 803 completely fills the second gap G2 between two lower mandrels 802A-1 and 802A-2 in the boundary define region BDR; and that the preliminary lower mask layer 803 is conformally formed on the resulting structure of FIG. 13B without completely filling the first gaps G1 between two adjacent lower mandrels in the device region 1000A.

In an exemplary embodiment, an anisotropic etching process including a reactive ion etching (RIE) process, for example, may apply to the resulting structure of FIG. 14C to form the lower mask patterns 803A and 803B of FIGS. 14A and 14B. In the RIE process, upper portions and lower portions of the preliminary lower mask layer 803 are removed to form the lower mask patterns 803A and 803B which remain on the sidewalls of the lower mandrels 802A and 802B.

Figure 15A:
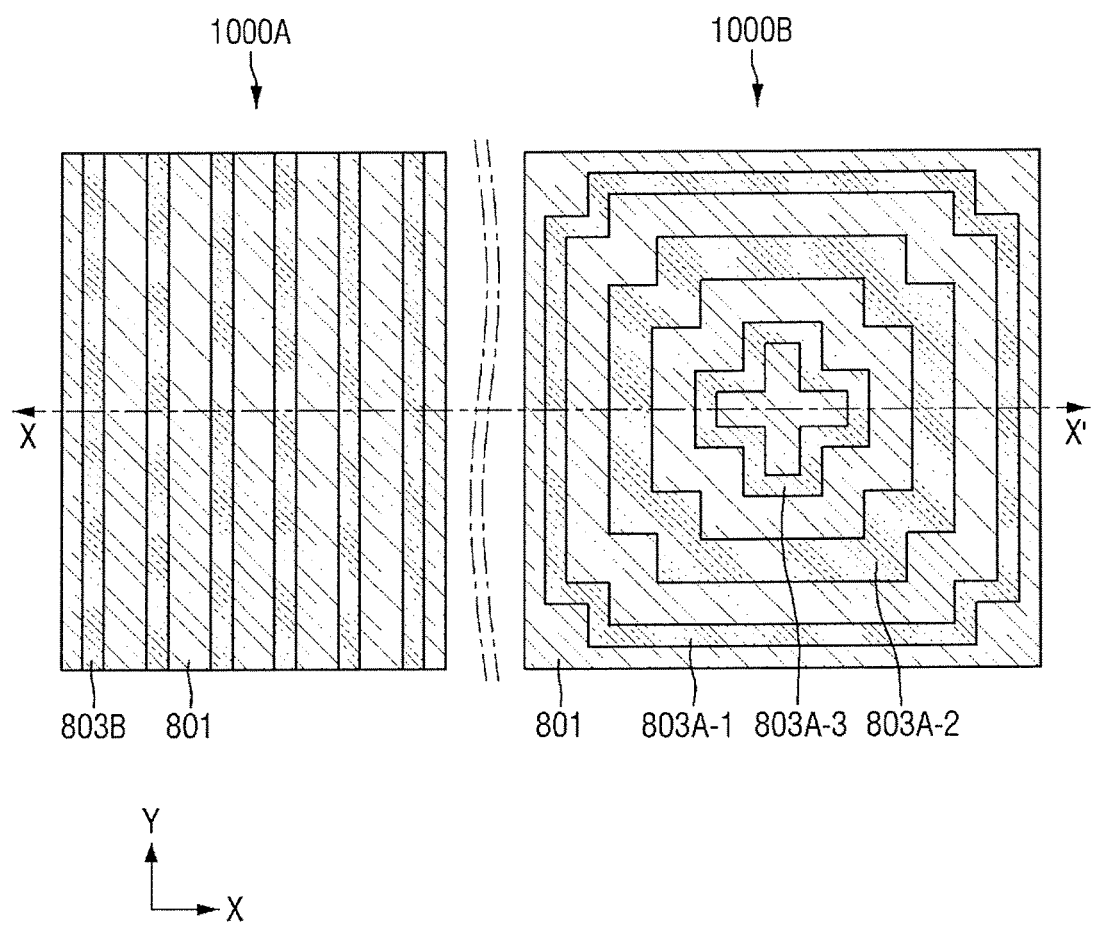
Figure 15B:
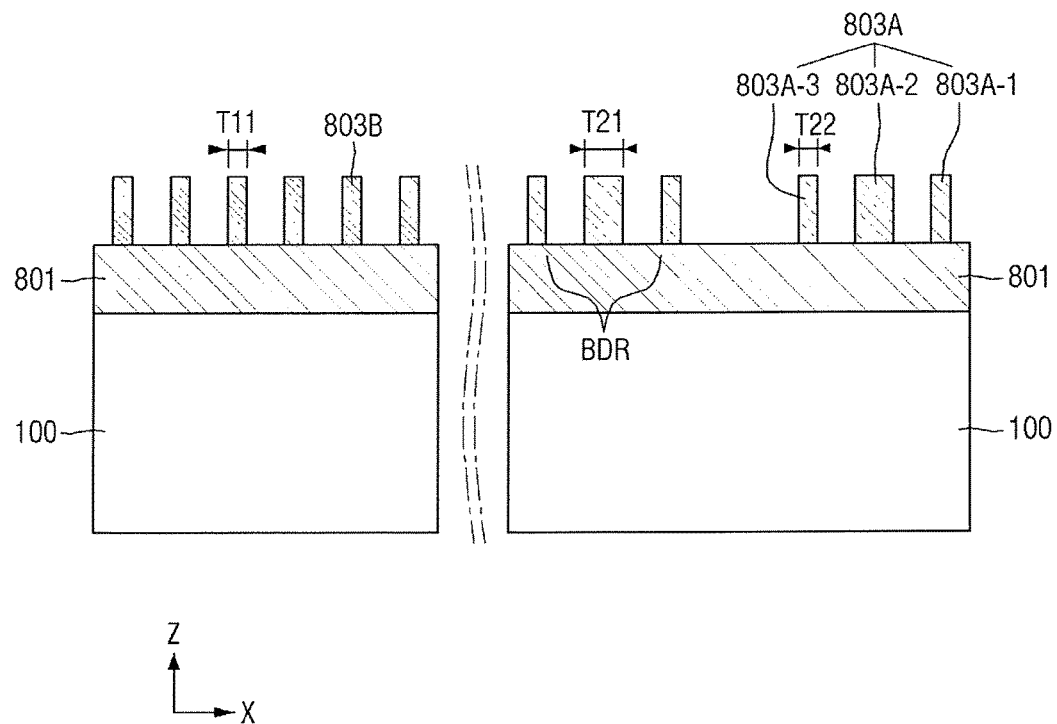

FIGS. 15A and 15B show removal of the lower mandrels 802A and 802B after performing step 1240 of FIG. 11 according to an exemplary embodiment of the present inventive concept. In step 1240, the lower mandrels 802A and 802B may be removed using an etching process, leaving behind the lower mask patterns 803A and 803B on the hard mask layer 801. The lower mask pattern 803A includes a first lower mask pattern 803A-1, a second lower mask pattern 803A-2 and a third lower mask pattern 803A-3. The lower mask patterns 803A-1 to 803A-3 are ring-shaped, and concentric.

In an exemplary embodiment, the lower mask pattern 803A-2 having the second thickness T21 is positioned in the boundary define region BDR. The lower mask pattern 803A-2 in the boundary define region BDR may have thickness T21 which is about two times the third thickness T22 or the first thickness T11. In FIG. 15A, the boundary define region BDR encloses the third lower mask pattern 803A-3 disposed within the second lower mask pattern 803A-2 in the overlay mark region 1000B. The first lower mask pattern 803A-1 encloses the boundary define region BDR.

Figure 16A:
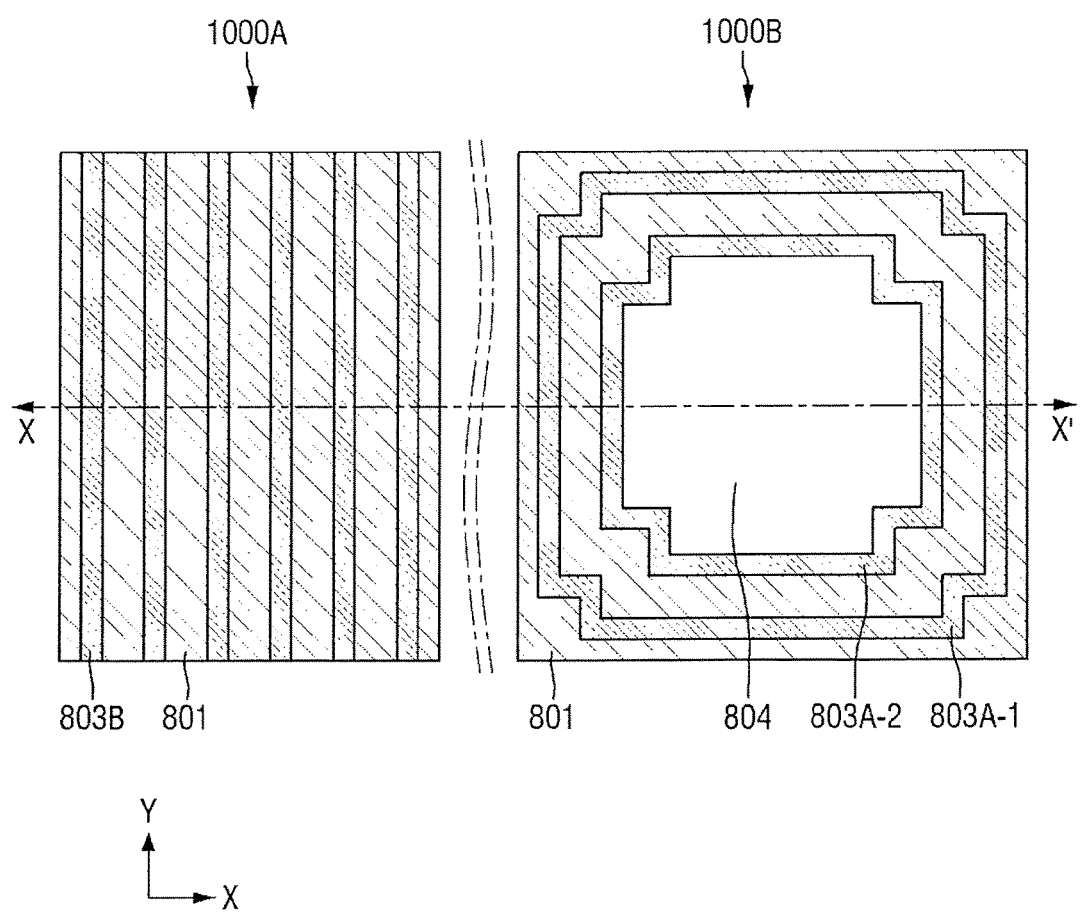
Figure 16B:
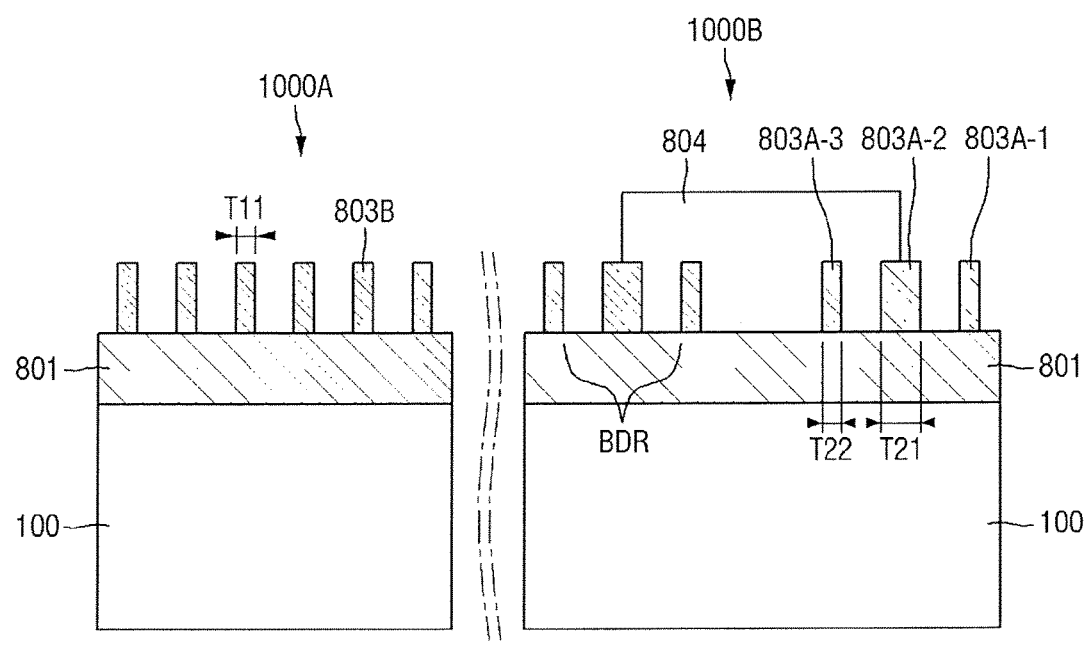

FIGS. 16A and 16B show an organic planarizing layer (OPL) 804 formed after performing step 1250 of FIG. 11 according to an exemplary embodiment of the present inventive concept. In step 1250, the OPL 804 is formed to cover the inside defined by the second lower mask pattern 803A-2 in the overlay mark region 1000B. The edge boundary of the OPL 804 is positioned within an upper surface of the second lower mask pattern 803A-2 having the second thickness T21 which is greater than the other lower mask patterns 803A-1 and 803A-3. In an exemplary embodiment, the upper surface of the second lower mask pattern 803A-2 is partially covered by the OPL 804, and the third lower mask pattern 803A-2 is completely covered by the OPL 804. The first lower mask pattern 803A-1 is not covered by the OPL 804.

After the formation of the OPL 804, the hard mask layer 801 of the overlay mark region 1000B is covered by the OPL and the lower mask patterns 803A-2 and 803A-1. The hard mask layer 801 is patterned using the OPL and the lower mask patterns 803A-2 and 803A-1 as an etch mask pattern. In an exemplary embodiment, a silicon anti-reflective coating (ARC) or an amorphous carbon layer may used instead of the OPL 804.

Figure 17A:
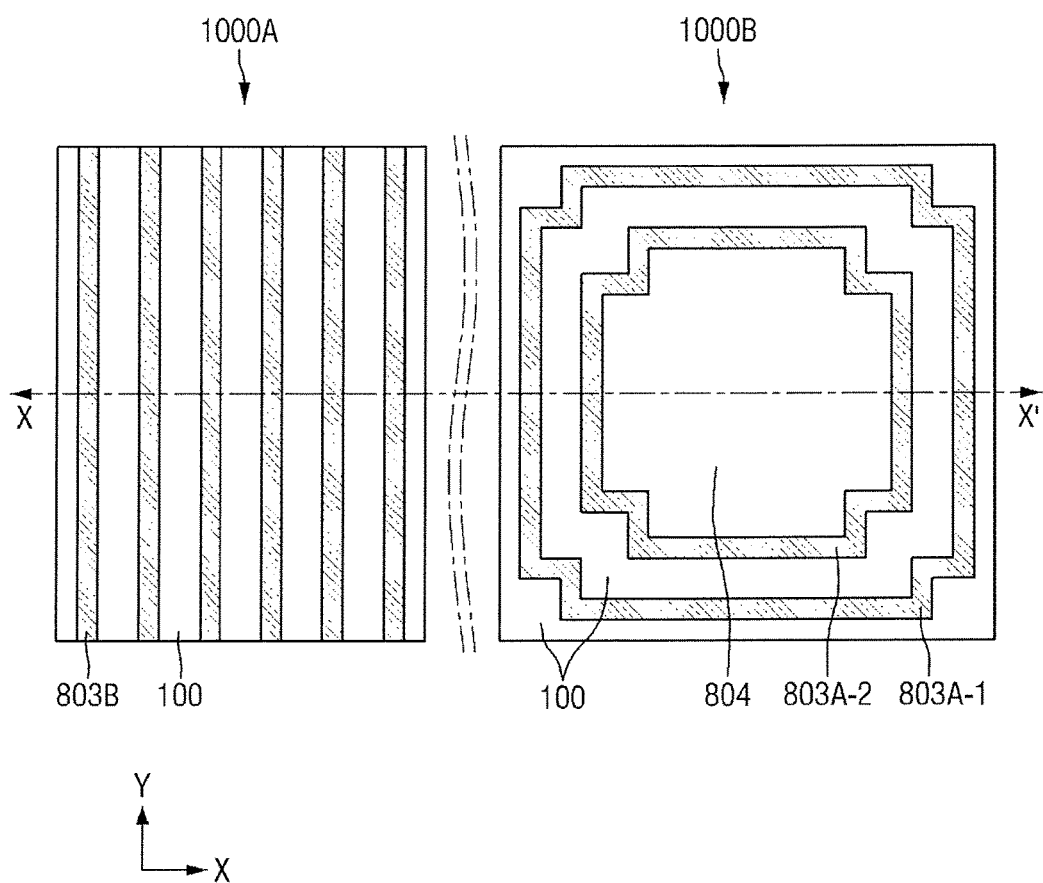
Figure 17B:
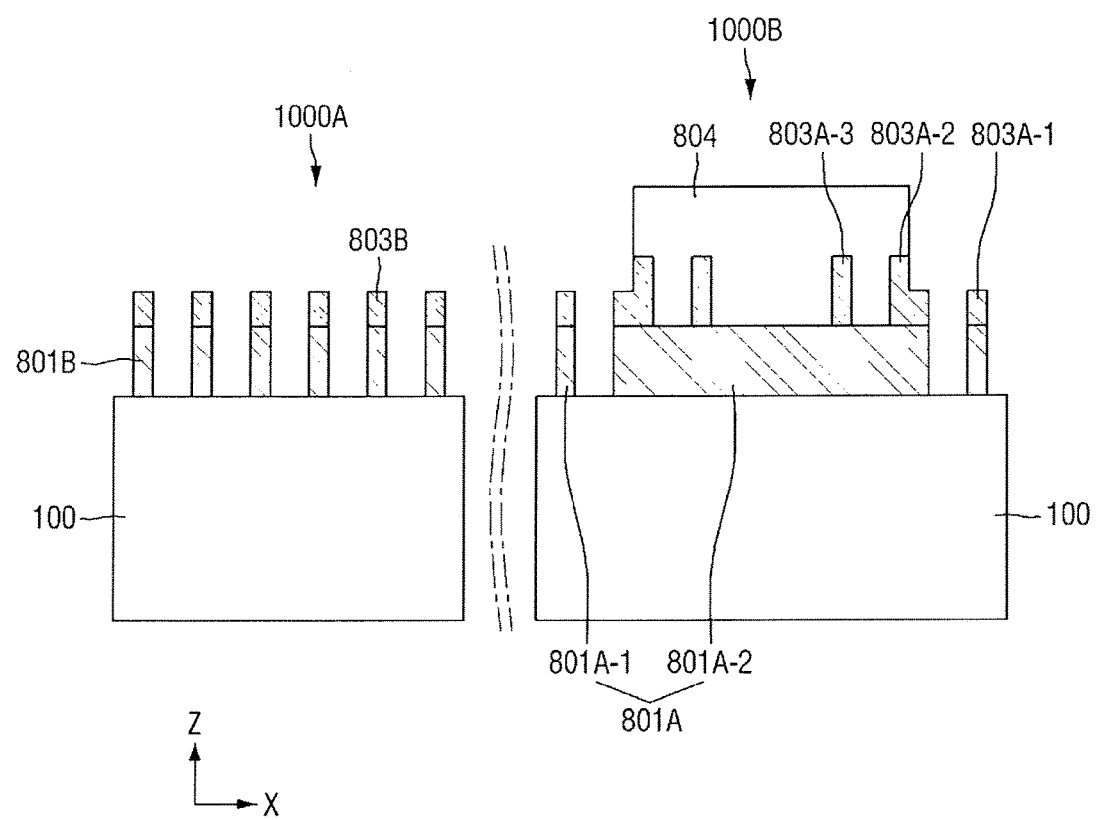

FIGS. 17A and 17B show the hard mask patterns 801A and 801B of FIGS. 8A and 8B formed after performing step 1260 of FIG. 11 according to an exemplary embodiment of the present inventive concept. In step 1260, the lower mask patterns 803A and 803B are partially removed while the hard mask patterns 801A and 801B are formed, and thus the thickness of the lower mask patterns 803A and 803B need to be sufficient so that the lower mask patterns 803A and 803B are not completely removed in the formation of the hard mask patterns 801A and 801B.

In an exemplary embodiment, the hard mask pattern 801A-2 for the plateau-shaped overlay mark 300 of FIG. 1 is formed using a combined mask structure of the OPL 804 and the second lower mask patterns 803A-2 as an etch mask in patterning the hard mask layer 801.

Figure 18:
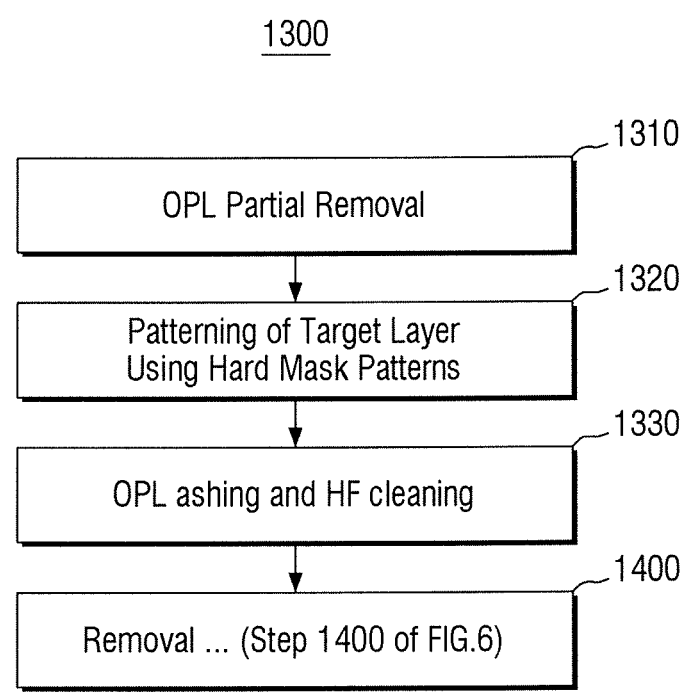
FIG. 18 shows a flowchart of patterning a target layer of step 1300 of FIG. 6.

Hereinafter, the patterning of the target layer 100 (step 1300 of FIG. 6) will be described with reference to FIGS. 18 to 22 according to an exemplary embodiment of the present inventive concept. FIG. 18 shows a flowchart of patterning the target layer 100 of step 1300 of FIG. 6. The patterning of the target layer 100 is performed using the hard mask patterns 801A and 801B of FIGS. 17A and 17B. FIGS. 19 to 22 show cross-sectional views of the device region 1000A and the overlay mark region 1000B according to an exemplary embodiment of the present inventive concept.

Figure 19:
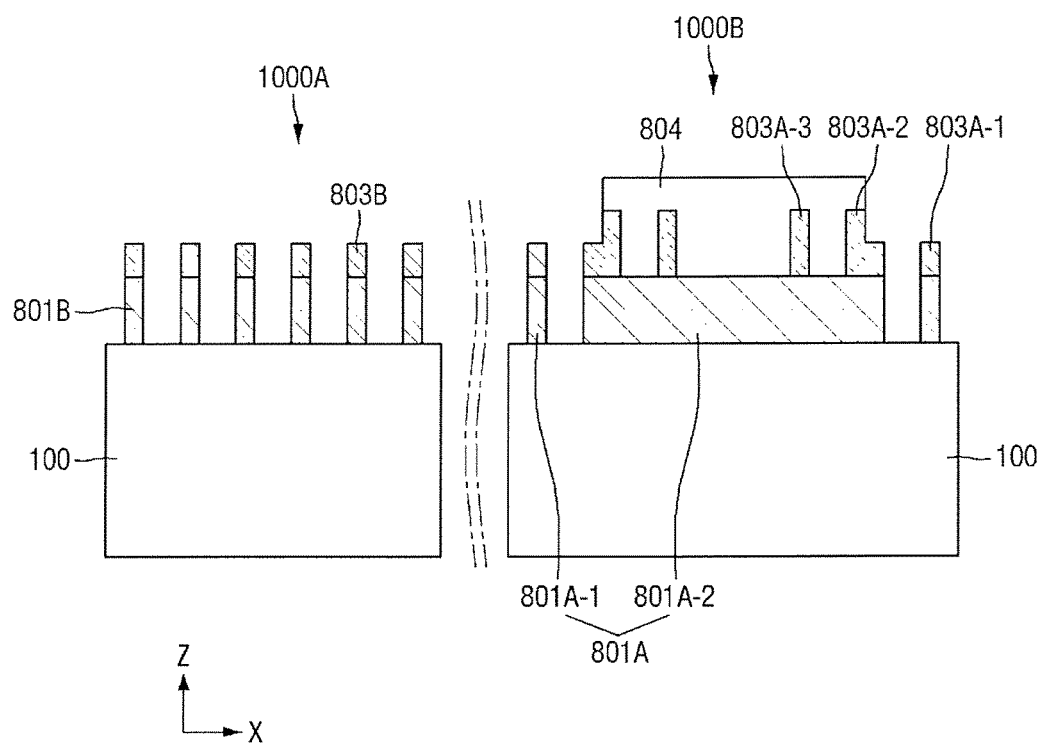
FIGS. 19 to 22 show cross-sectional views of a device region and an overlay mark region according to an exemplary embodiment of the present inventive concept.

FIG. 19 shows partial removal of the OPL 804 formed after performing step 1310 of FIG. 18 according to an exemplary embodiment of the present inventive concept. In step 1310, the thickness of the OPL 804 is reduced to the extent that the OPL is substantially removed in the subsequent step of 1320. In an exemplary embodiment, step 1310 may be omitted.

Figure 20:
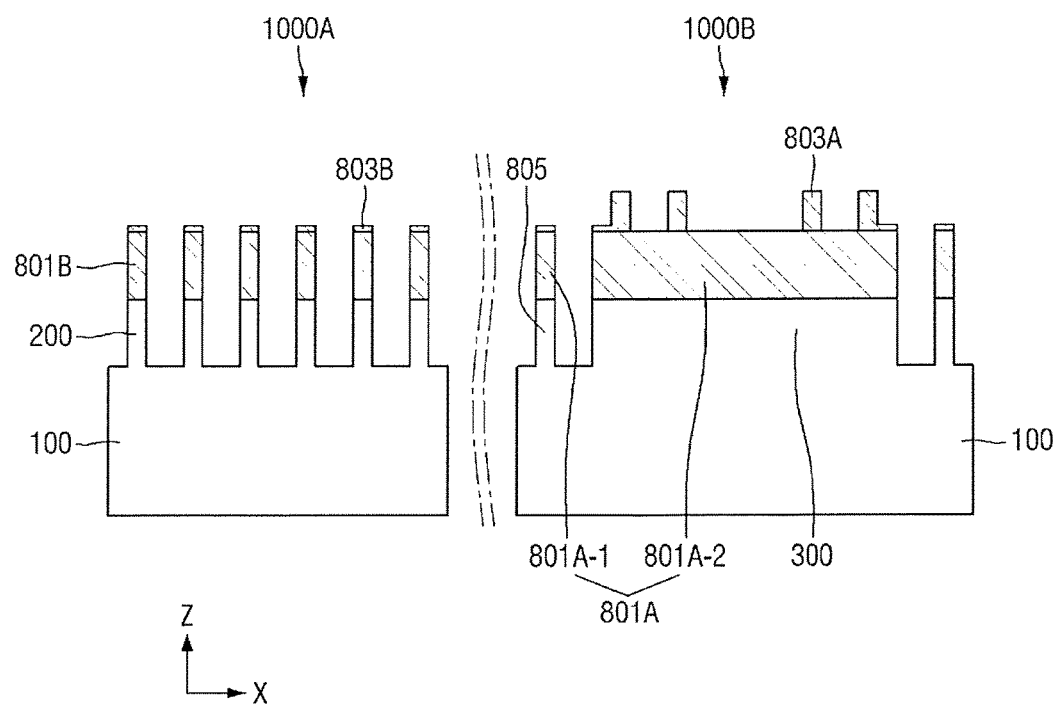

FIG. 20 shows the fin-type structures 200 and the plateau-shaped overlay mark 300 of FIG. 1 formed after performing step 1320 of FIG. 18. In step 1320, an anisotropic etching process including an RIE process, for example, may be applied to pattern an upper region of the target layer 100 into the fin-type structures 200 and the plateau-shaped overlay mark 300. The redundant fin type structure 805 is also formed in the etching process. In the etching process, the lower mask patterns 803A and 803B, and the OPL 804 may be partially etched. After performing step 1320, the lower mask patterns 803A and 803B may remain on the hard mask patterns 801A and 801B, and the OPL 804 is completely removed.

Figure 21:
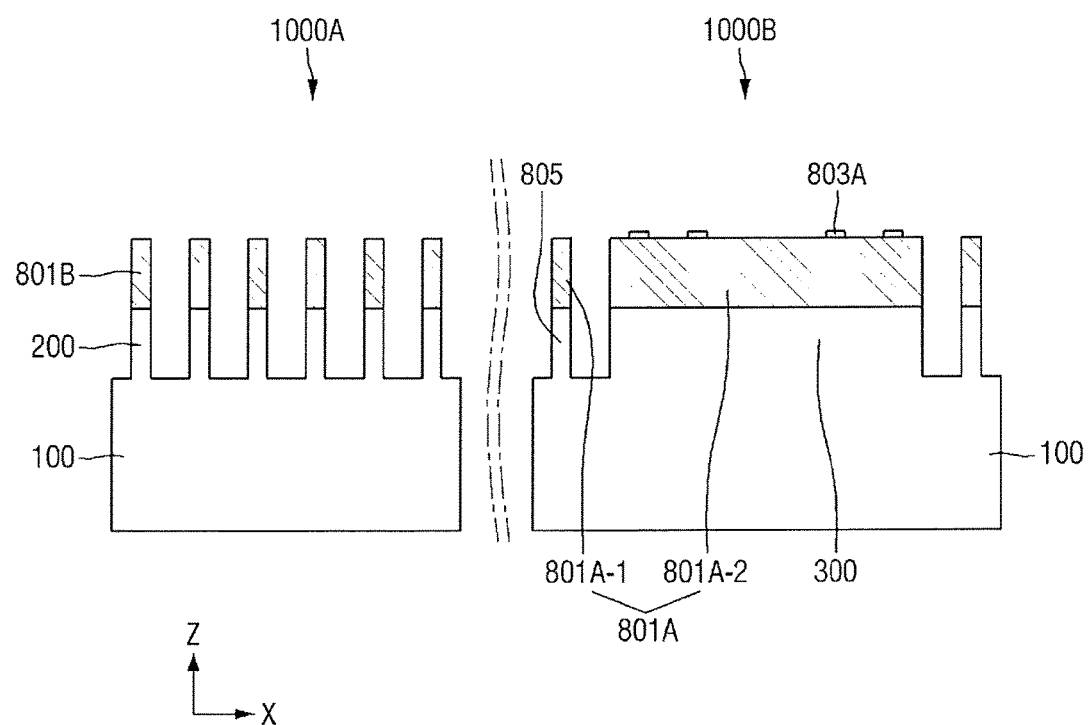

FIG. 21 shows a resulting structure after performing step 1330. In step 1330, an OPL ashing process and a cleaning process may be applied to the resulting structure of FIG. 20. The OPL ashing process may be applied to remove any residue of the OPL 804. The cleaning process may include a HF cleaning process. In this case, the lower mask patterns 803A and 803B may be partially removed to have a reduced thicknesses. In an exemplary embodiment, the lower mask patterns 803B of the device region 1000A may be completely removed; the lower mask patterns 803A of the overlay mark region 1000B may remain having a reduced thicknesses.

Figure 22:
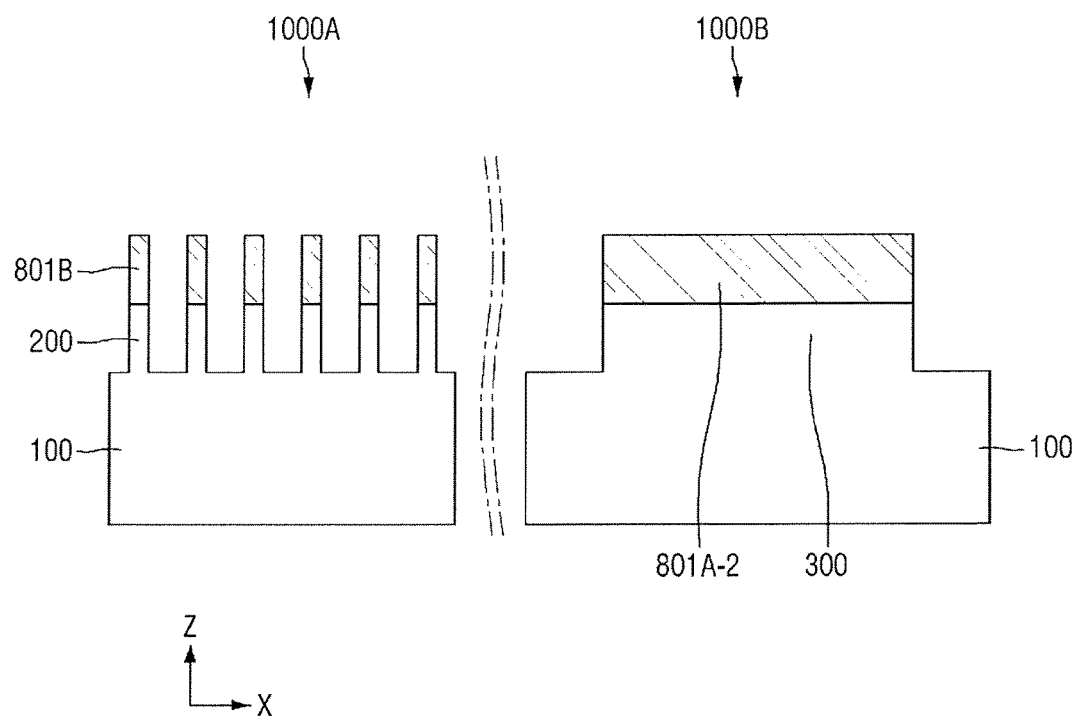

FIG. 22 shows a resulting structure after performing step 1400 of FIG. 6 according to an exemplary embodiment of the present inventive concept. In step 1400, the redundant fin-type structures 805 of the overlay mark region 1000B are removed. In an exemplary embodiment, a chemical-mechanical polishing (CMP) process may be applied to remove the lower mask patterns 803A of FIG. 21.

Hereinafter, the patterning of the lower mandrel layer (step 1220 of FIG. 11) will be described with reference to FIGS. 23, 24, 25A to 28A, 25B to 28B and 26C according to an exemplary embodiment of the present inventive concept.

Figure 23:
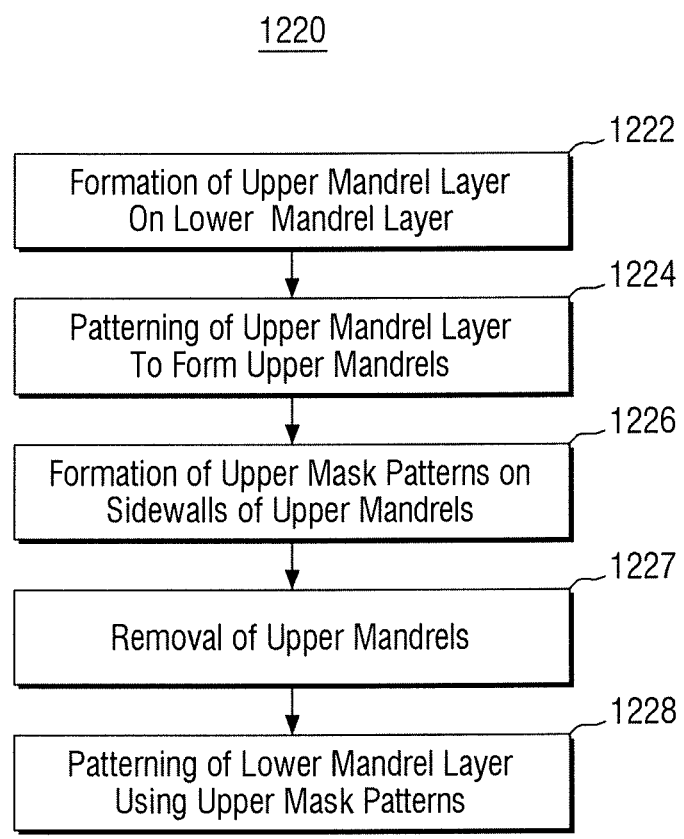
FIG. 23 shows a flowchart of patterning a lower mandrel layer of step 1220 of FIG. 11 according to an exemplary embodiment of the present inventive concept.
Figure 24:
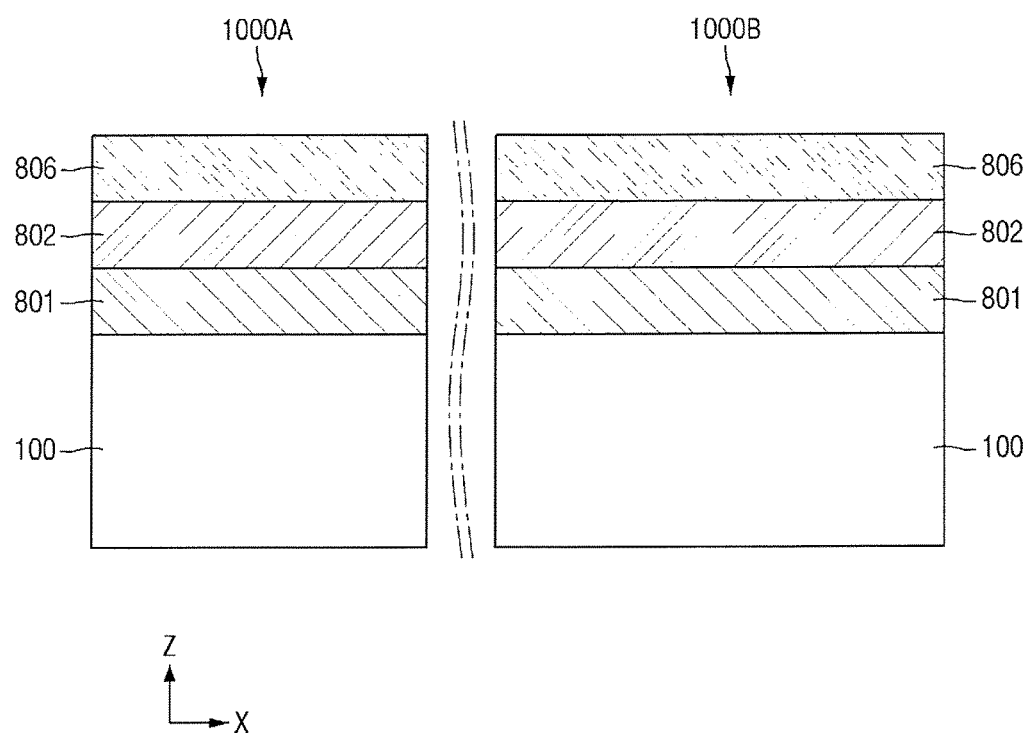
FIG. 24 shows a cross-sectional view of a device region and an overlay mark region according to an exemplary embodiment of the present inventive concept.

FIG. 23 shows a flowchart of patterning the lower mandrel layer 802 of step 1220 of FIG. 11 according to an exemplary embodiment of the present inventive concept. FIG. 24 shows a cross-sectional view of a device region 1000A and an overlay mark region 1000B according to an exemplary embodiment of the present inventive concept. FIGS. 25A to 28A show planar views of the device region 1000A and the overlay mark region 1000B according to an exemplary embodiment of the present inventive concept. FIGS. 25B to 28B show cross-sectional views of the device region 1000A and the overlay mark region 1000B, taken along line X-X' of FIGS. 25A to 28A, according to an exemplary embodiment of the present inventive concept. FIG. 26C shows a preliminary upper mask layer which is conformally formed on the resulting structure of FIGS. 26A and 26B, according to an exemplary embodiment of the present inventive concept.

FIG. 24 shows an upper mandrel layer 806 formed on the lower mandrel layer 802 after performing step 1222 according to an exemplary embodiment of the present inventive concept. The lower mandrel layer 802 is formed on the hard mask layer 801. The upper mandrel layer 806 is formed on the resulting structure of FIG. 12. In an exemplary embodiment, the hard mask layer 801 may be patterned using the lower mandrel layer 802 and the upper mandrel layer 806 to serve as an etch mask for patterning the target layer 100. In an exemplary embodiment, the upper mandrel layer 806 may be formed of amorphous carbon.

Figure 25A:
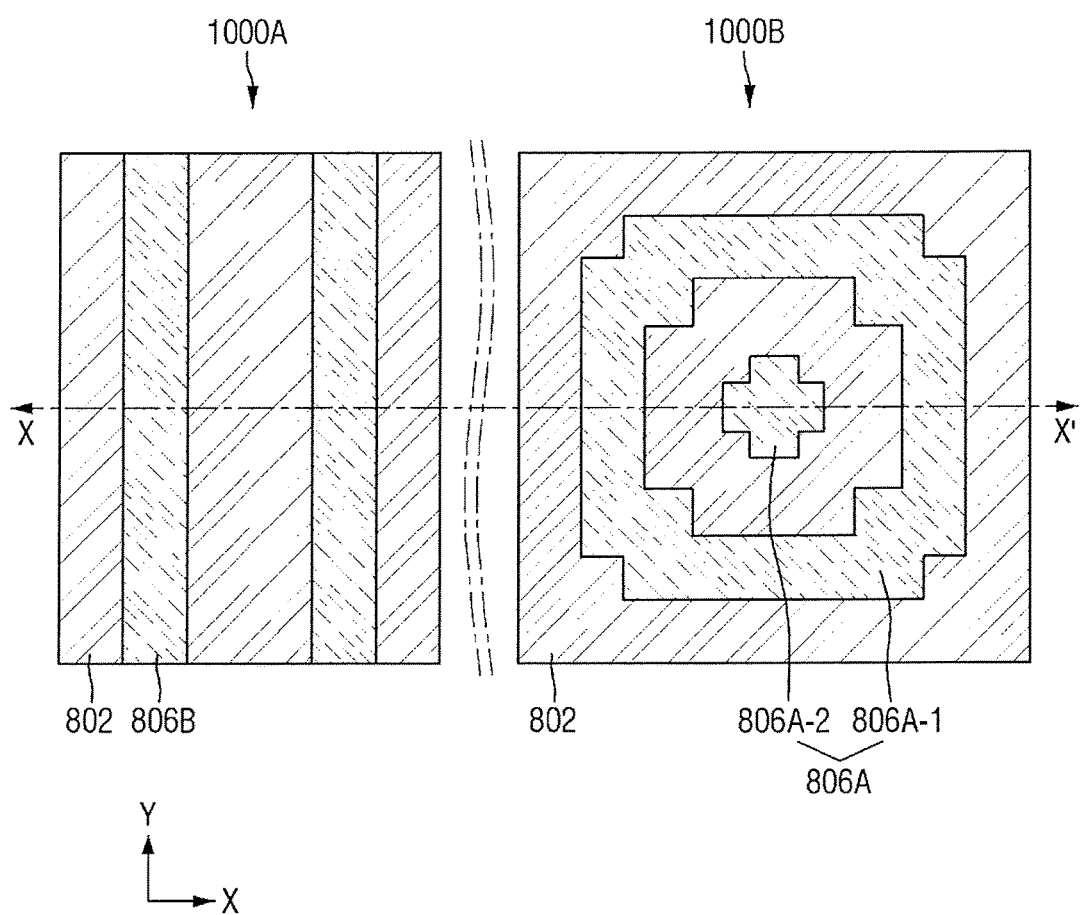
Figure 25B:
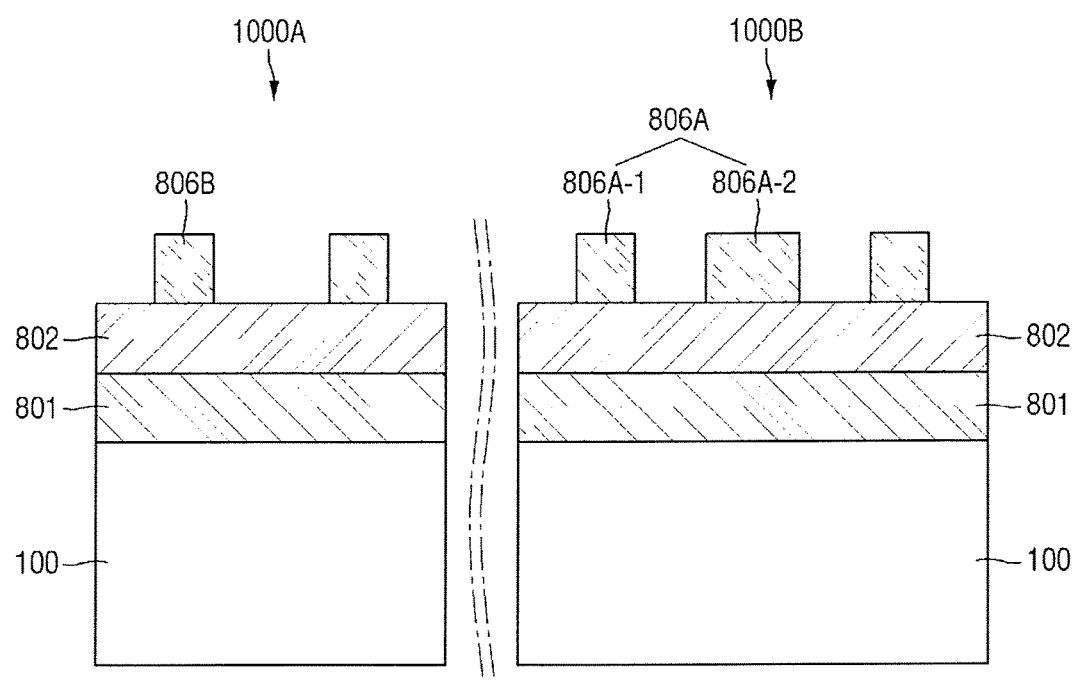

FIGS. 25A and 25B show upper mandrels 806A and 806B formed after performing step 1224 according to an exemplary embodiment of the present inventive concept. The upper mandrels 806A and 806B are formed on the lower mandrel layer 802. In the device region 1000A, the upper mandrels 806B are extended in parallel along the second direction (y-axis). In the overlay mark region 1000B, the upper mandrels 806A include a first upper mandrel 806A-1 and a second upper mandrel 806A-2. The first upper mandrel 806A-1 is ring-shaped, and the second upper mandrel 806A-2 is cross-hair shaped. The first upper mandrel 806A-1 surrounds the second upper mandrel 806A-2. In an exemplary embodiment, the second upper mandrel 806A-2 is positioned at the center of the first upper mandrel 806A-1.

Figure 26A:
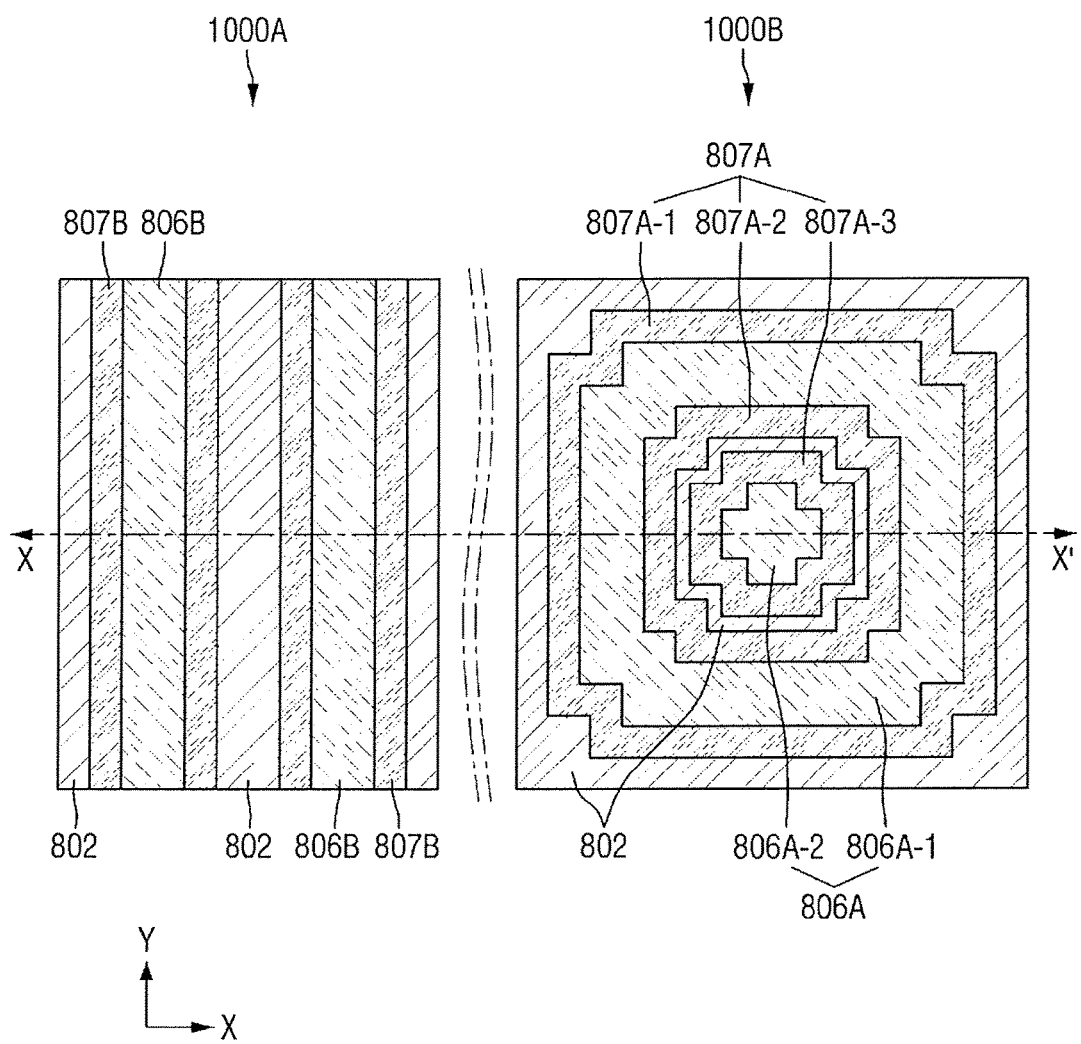
Figure 26B:
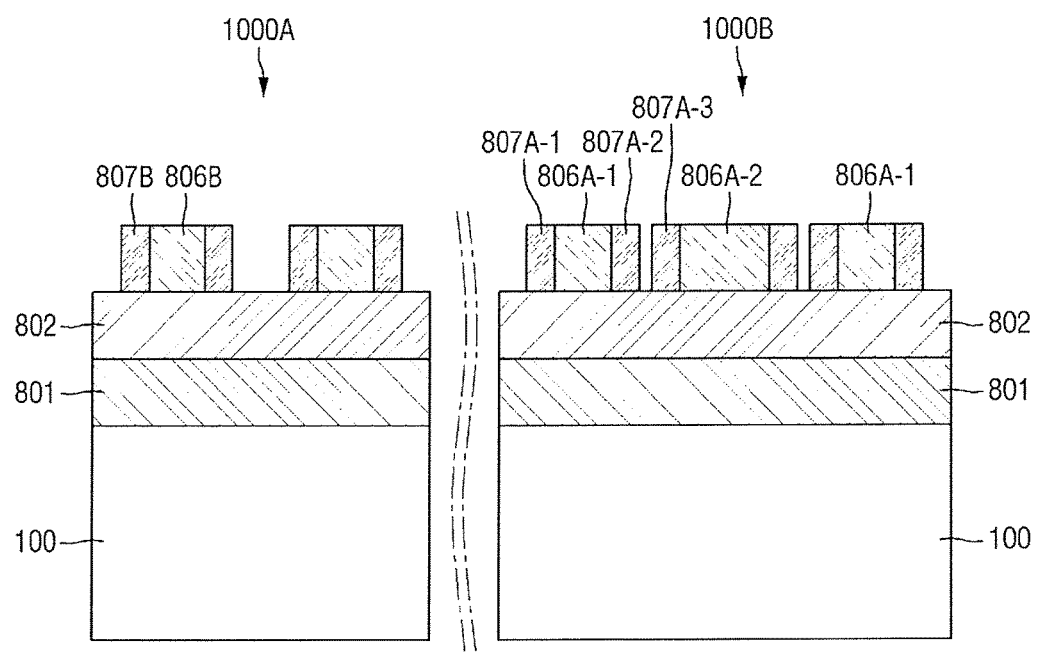
Figure 26C:
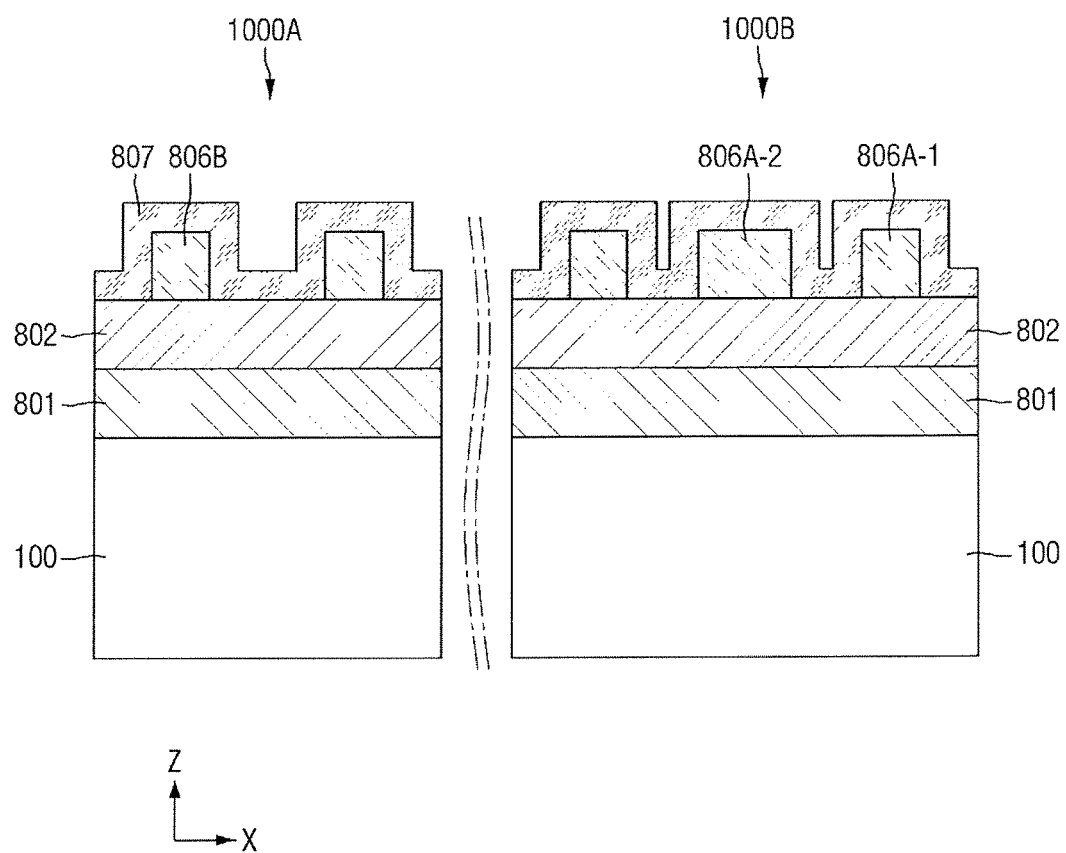
FIG. 26C shows a preliminary upper mask layer which is conformally formed on the resulting structure of FIGS. 26A and 26B, according to an exemplary embodiment of the present inventive concept.

FIGS. 26A and 26B show upper mask patterns 807A and 807B formed after performing step 1226 according to an exemplary embodiment of the present inventive concept. The upper mask patterns 807A and 807B are formed on sidewalls of the upper mandrels 806A and 806B. The lower mandrel layer 802 is exposed through the upper mask patterns 807A and 807B.

FIG. 26C shows a preliminary upper mask layer 807 which is conformally formed on the resulting structure of FIGS. 25A and 25B. The thickness of the preliminary upper mask layer 807 is such that the preliminary upper mask layer 807 does not completely fill gaps between two upper mandrels 806B in the device region 1000A. The thickness of the preliminary upper mask layer 807 is such that the preliminary upper mask layer 807 does not completely fill gaps between two upper mandrels 806A-1 and 806A-2 in the overlay mark region 1000B.

In an exemplary embodiment, an anisotropic etching process including a reactive ion etching (RIE) process, for example, may apply to the resulting structure of FIG. 26C so that upper portions and lower portions of the preliminary upper mask layer 807 are removed to form the upper mask patterns 807A and 807B remaining on the sidewalls of the upper mandrels 806A and 806B.

Figure 27A:
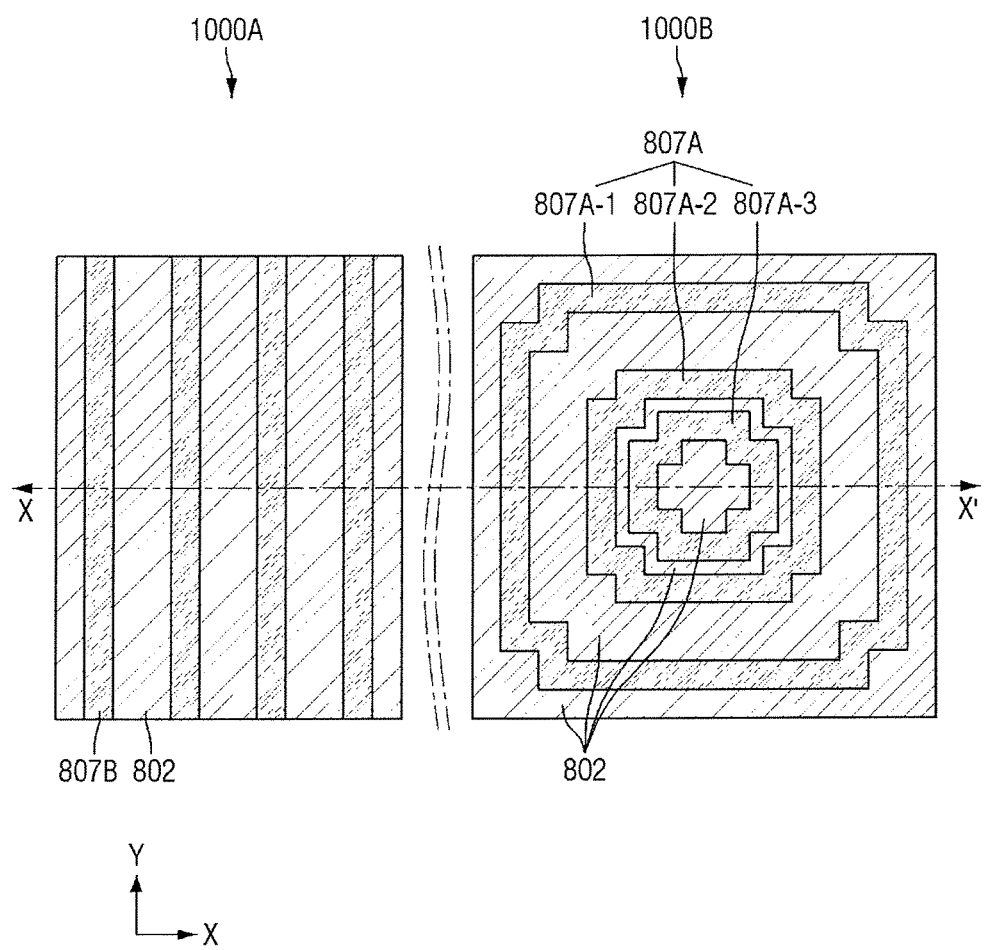
Figure 27B:
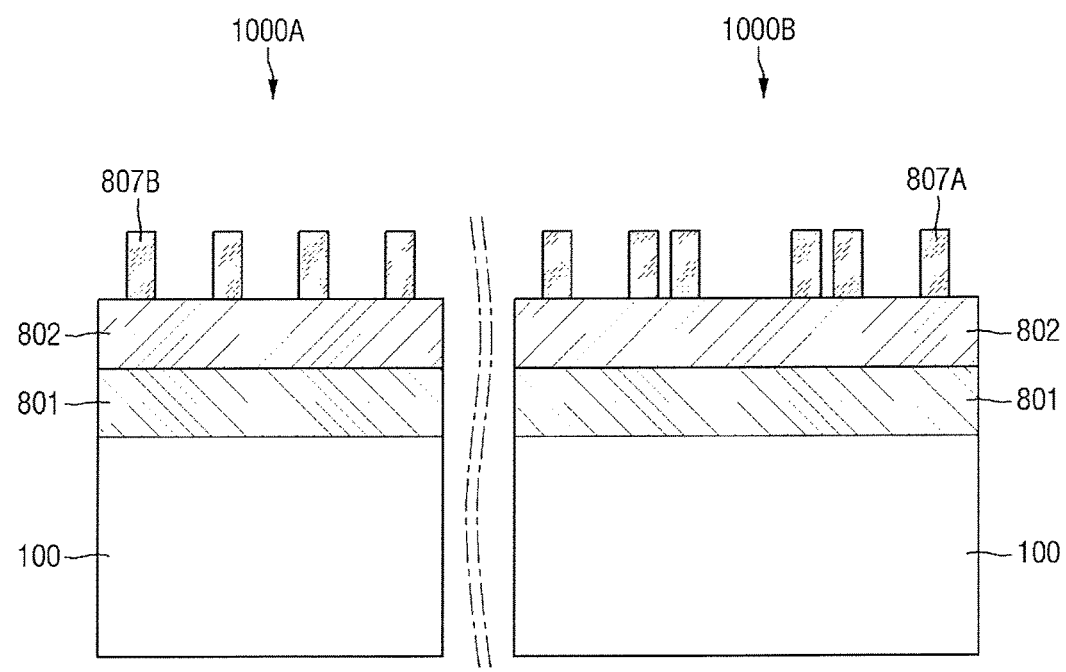

FIGS. 27A and 27B show removal of the upper mandrels 806A and 806B after performing step 1227 according to an exemplary embodiment of the present inventive concept. In an etching process, the upper mandrels 806A and 806B are removed leaving behind the upper mask patterns 807A and 807B.

Figure 28A:
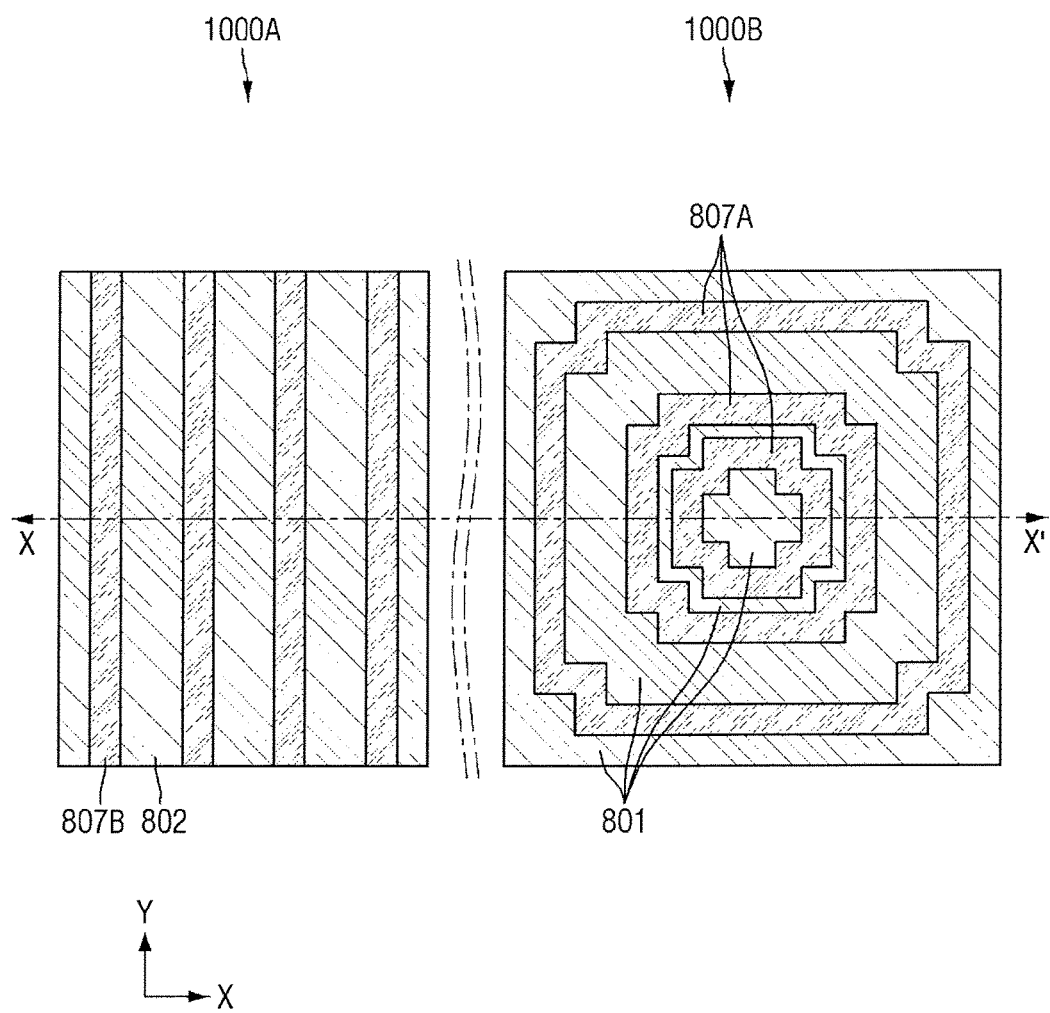
Figure 28B:
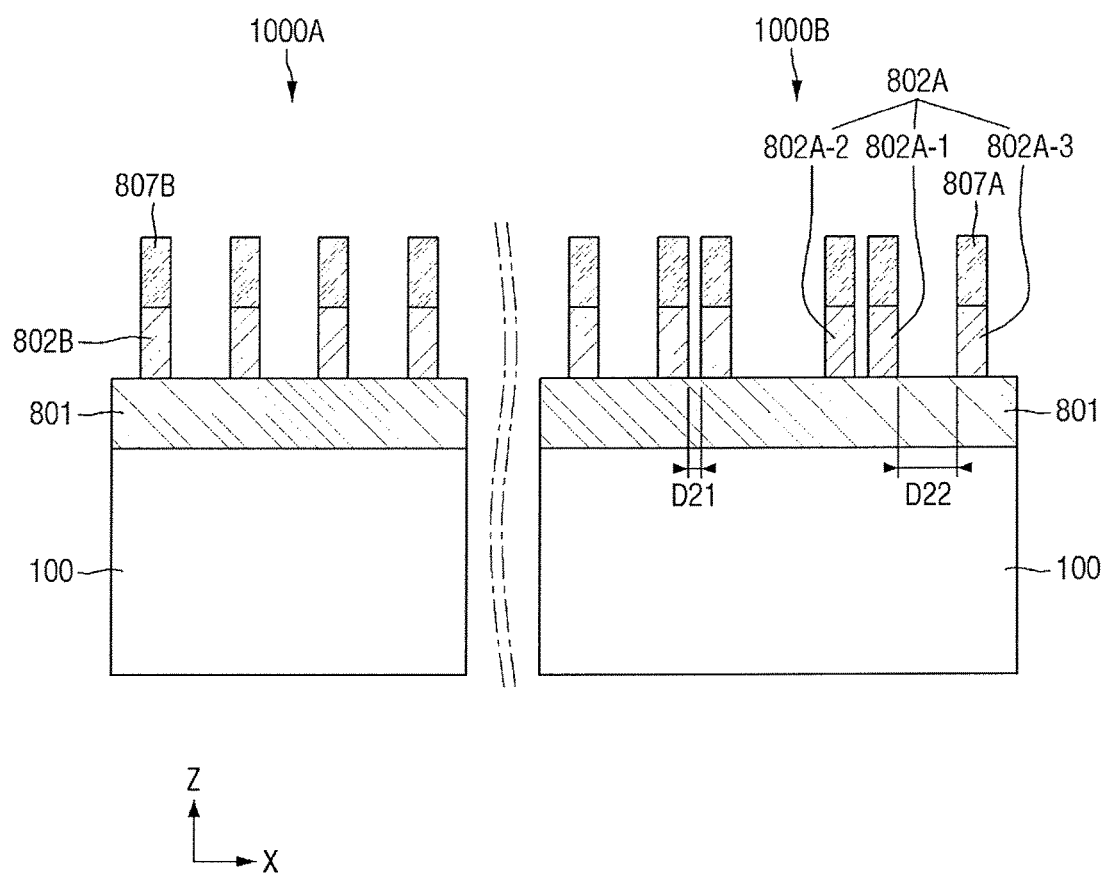

FIGS. 28A and 28B show lower mandrels 802A and 802B formed after performing step 1228 according to an exemplary embodiment of the present inventive concept. In an etching process using an anisotropic etching process including an RIE process, the lower mandrel layer 802 is patterned into the lower mandrels 802A and 802B. In the device region 1000A, the lower mandrels 802B are spaced from each other at a uniform distance; in the overlay mark region 1000B, the lower mandrels 802A are spaced apart from each other at different distances D21 and D22, for example.

In an exemplary embodiment, the lower mandrels 802A includes a first lower mandrel 802A-1, a second lower mandrel 802A-2, and a third lower mandrel 802A-3. For the convenience of description, FIGS. 13A and 13B omit the third lower mandrel 802A-3. The first lower mandrel 802A-1 and the second lower mandrel 802A-2 are spaced apart from each other at the second distance D21; the first lower mandrel 802A-1 and the third lower mandrel 802A-3 are spaced apart from each other at a third distance D22.

In an exemplary embodiment, the upper mask patterns 807A and 807B may be removed to form the resulting structure of FIGS. 13A and 13B. For the convenience of descriptions, the outermost or the third lower mandrel 802A-3 of the overlay mark region 1000B is omitted in FIGS. 13A and 13B. For example, FIGS. 13A and 13B shows two inner lower mandrels 802A-1 and 802A-2. The lower mandrels 802A-1 to 802A-3 of the overlay mark region 1000B are ring-shaped and concentric.

Hereinafter, the patterning of the upper mandrel layer 806 (step 1224 of FIG. 23) will be described with reference to FIGS. 29, 30, 31A to 34A and 31B to 34B according to an exemplary embodiment of the present inventive concept.

Figure 29:
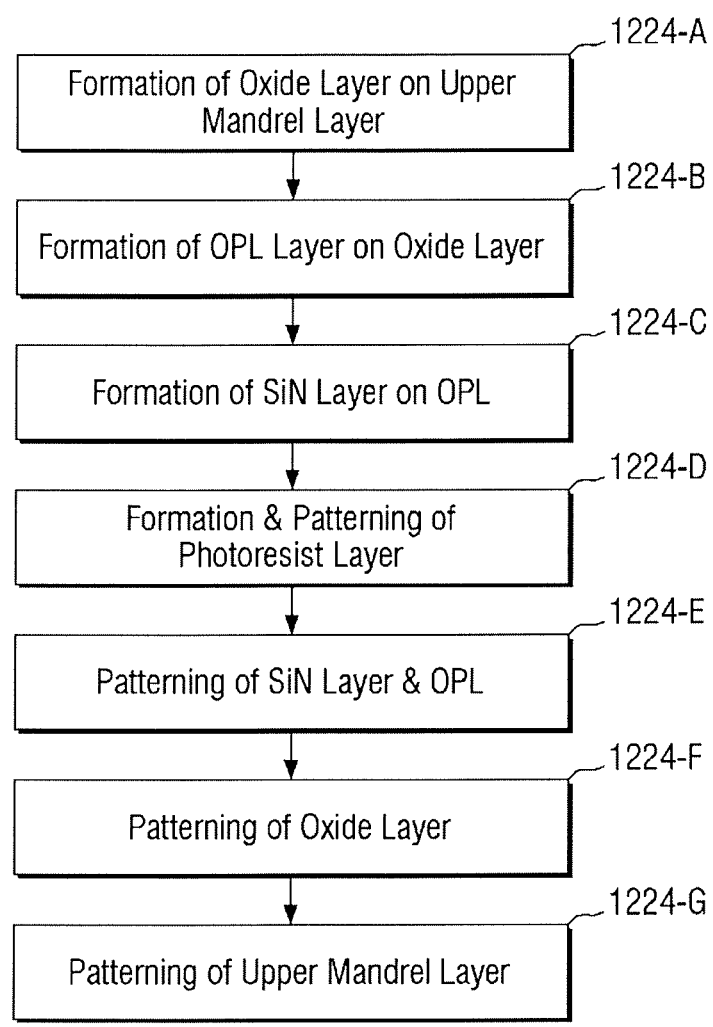
FIG. 29 shows a flowchart of patterning an upper mandrel layer of step 1224 of FIG. 23 according to an exemplary embodiment of the present inventive concept.
Figure 30:
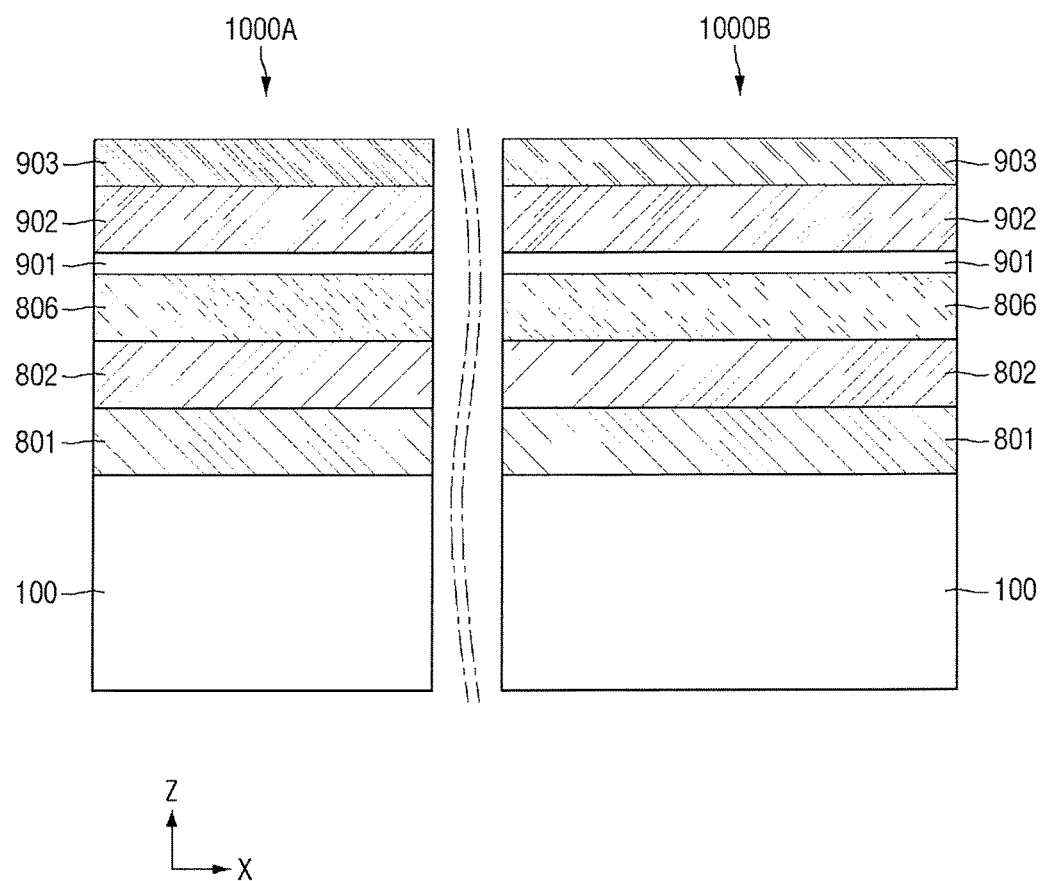
FIG. 30 shows a cross-sectional view of a device region and an overlay mark region according to an exemplary embodiment of the present inventive concept.

FIG. 29 shows a flowchart of patterning the upper mandrel layer 806 of step 1224 of FIG. 23 according to an exemplary embodiment of the present inventive concept. FIG. 30 shows a cross-sectional view of a device region and an overlay mark region according to an exemplary embodiment of the present inventive concept. FIGS. 31A to 34A show planar views of the device region and the overlay mark region according to an exemplary embodiment of the present inventive concept. FIGS. 31B to 34B show cross-sectional views of the device region and the overlay mark region, taken along line X-X' of FIGS. 31A to 34A, according to an exemplary embodiment of the present inventive concept.

FIG. 30 shows an oxide layer 901, an upper OPL 902 and a SiN layer 903 formed on the upper mandrel layer 806 in the listed sequence after performing steps 1224-A to 1224-C of FIG. 29 according to an exemplary embodiment of the present inventive concept.

Figure 31A:
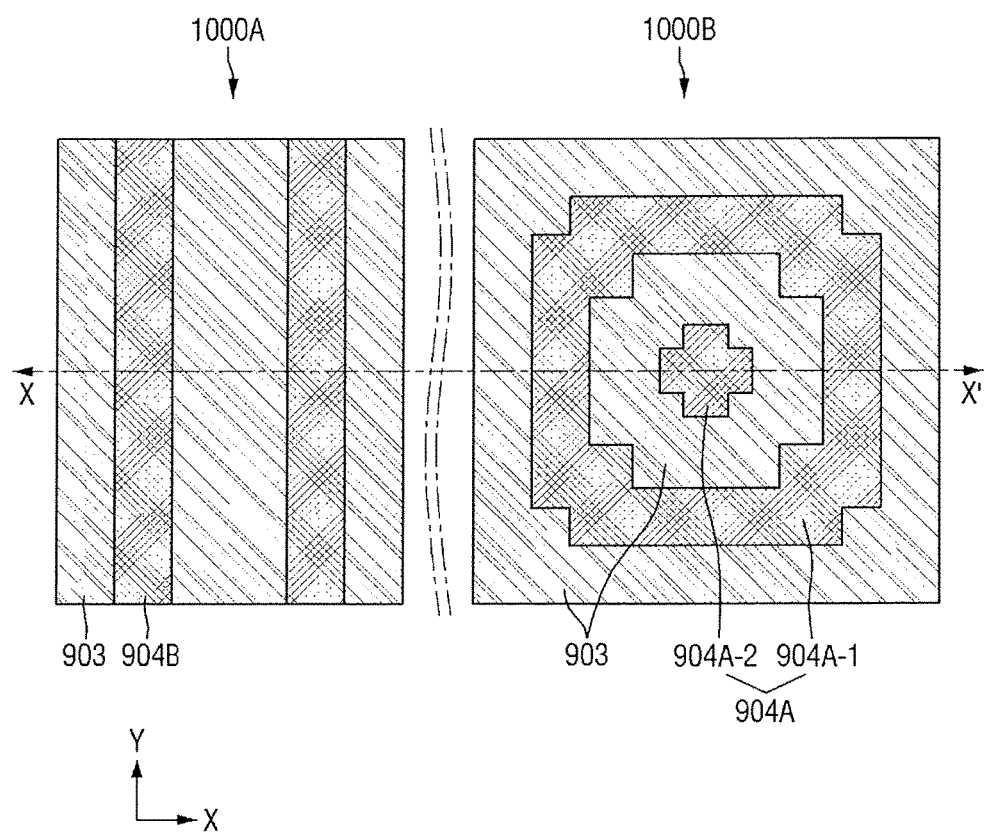
Figure 31B:
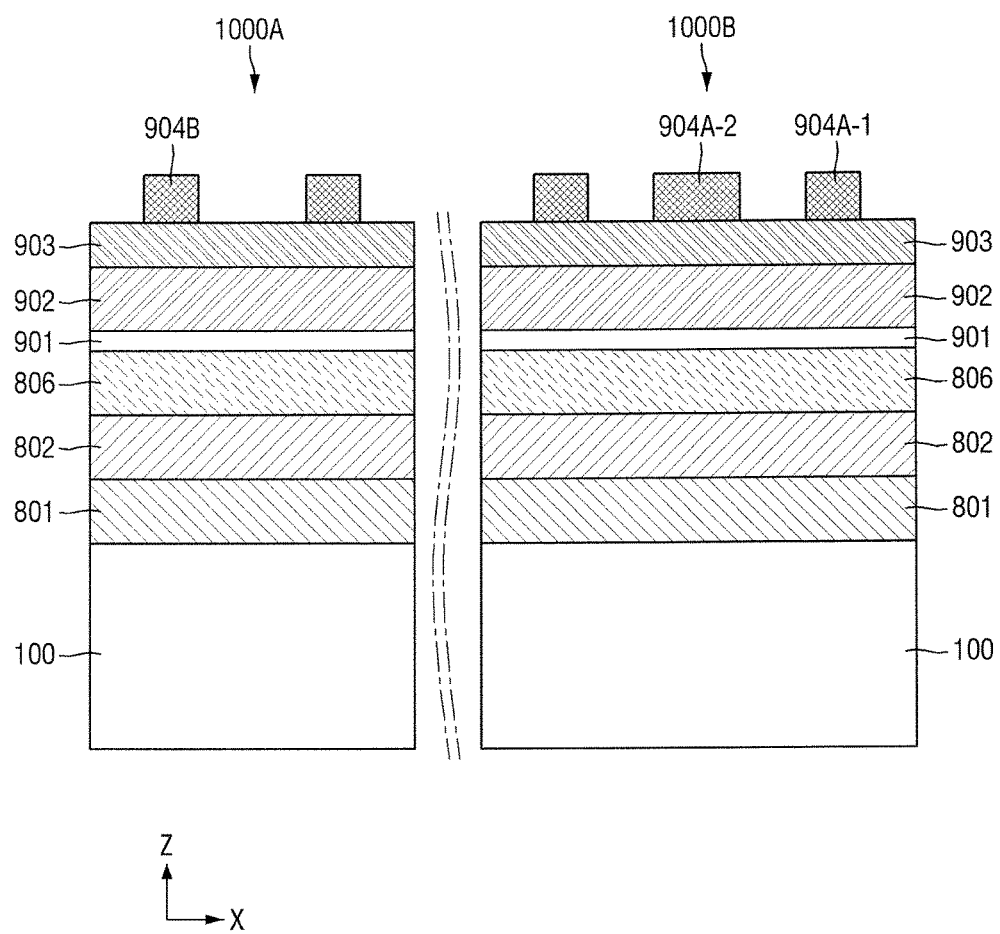

FIGS. 31A and 31B show photoresist patterns 904A and 904B formed after performing step 1224-D of FIG. 29 according to an exemplary embodiment of the present inventive concept. The photoresist patterns 904B are extended in parallel along the second direction (y-axis) in the device region 1000A. The photoresist pattern 904A includes a first photoresist pattern 904A-1 and a second photoresist pattern 904A-2 on the overlay mark region 1000B. The first photoresist pattern 904A-1 is ring-shaped, and the second photoresist pattern 904A-2 is positioned at the center of the first photoresist pattern 904A-1. The first and the second photoresist patterns 904A-1 and 904A-2 are spaced apart from each other.

A photoresist layer (not shown here) may be formed of a photoresist material, and may be formed on the SiN layer 903. The photoresist layer is patterned into the photoresist patterns 904A and 904B using a photolithography process.

Figure 32A:
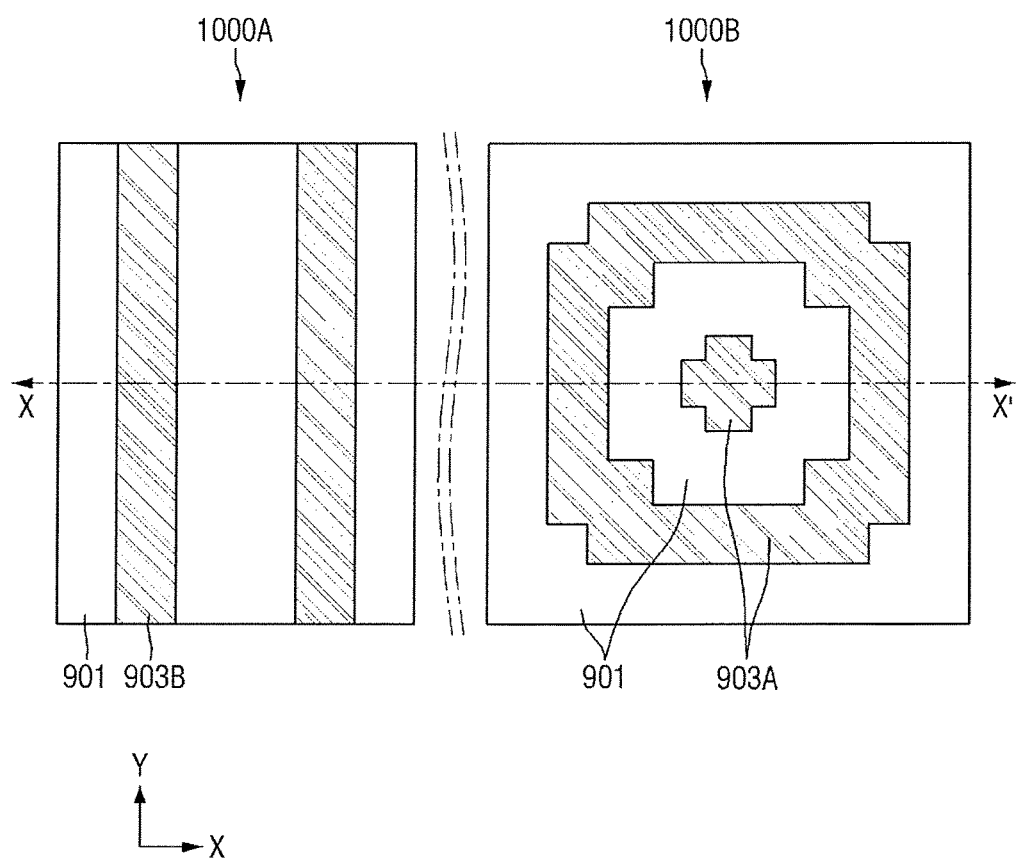
Figure 32B:
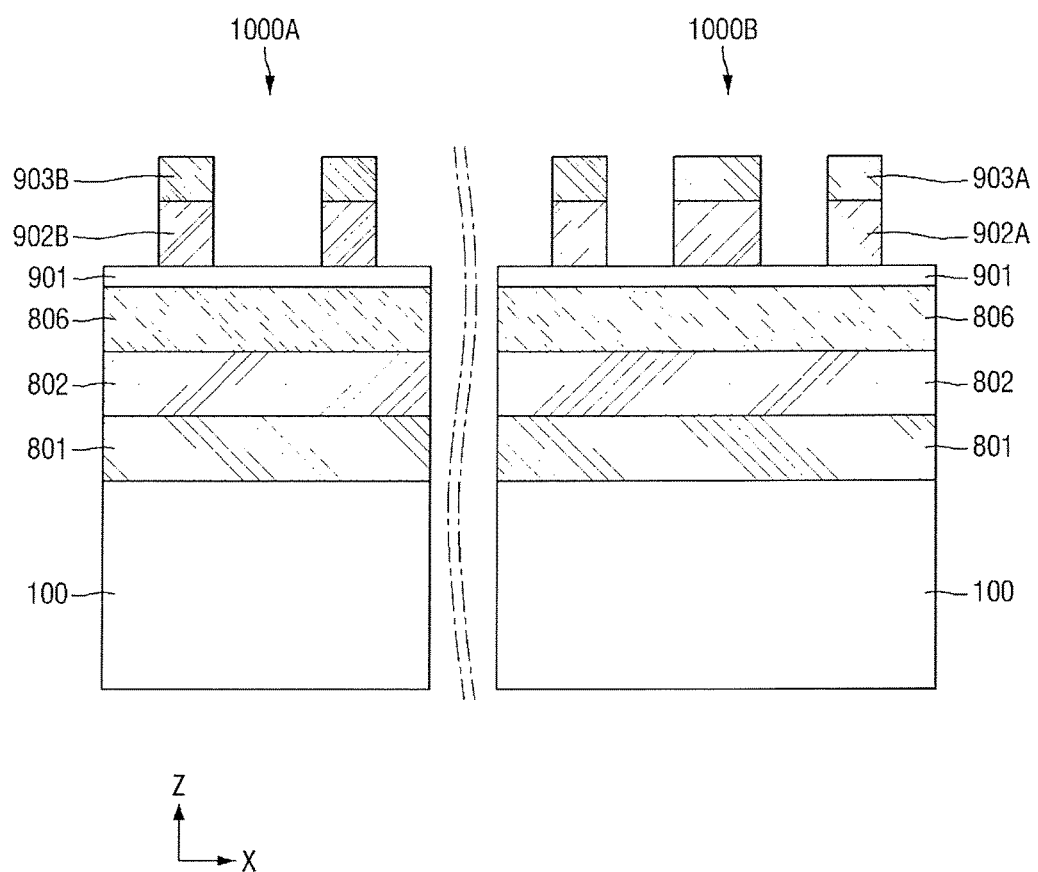

FIGS. 32A and 32B show SiN patterns 903A and 903B and upper OPL patterns 902A and 902B formed after performing step 1224-E according to an exemplary embodiment of the present inventive concept. The SiN layer 903 and the upper OPL 902 are patterned by etching exposed regions through the photoresist patterns 904A and 904B to form the SiN patterns 903A and 903B and the upper OPL patterns 902A and 902B. For example, the patterned structure of the photoresist patterns 904A and 904B may be transferred to the SiN layer 903 and the upper OPL 902 to form the SiN patterns 903A and 903B and the upper OPL patterns 902A and 902B. The etching process may use etchants of the upper OPL 902 and the SiN layer 903 having etch selectivity with respect to the oxide layer 901. In the etching process, the photoresist patterns 904A and 904B are removed. In an exemplary embodiment, the photoresist patterns 904A and 904B may be partially removed.

Figure 33A:
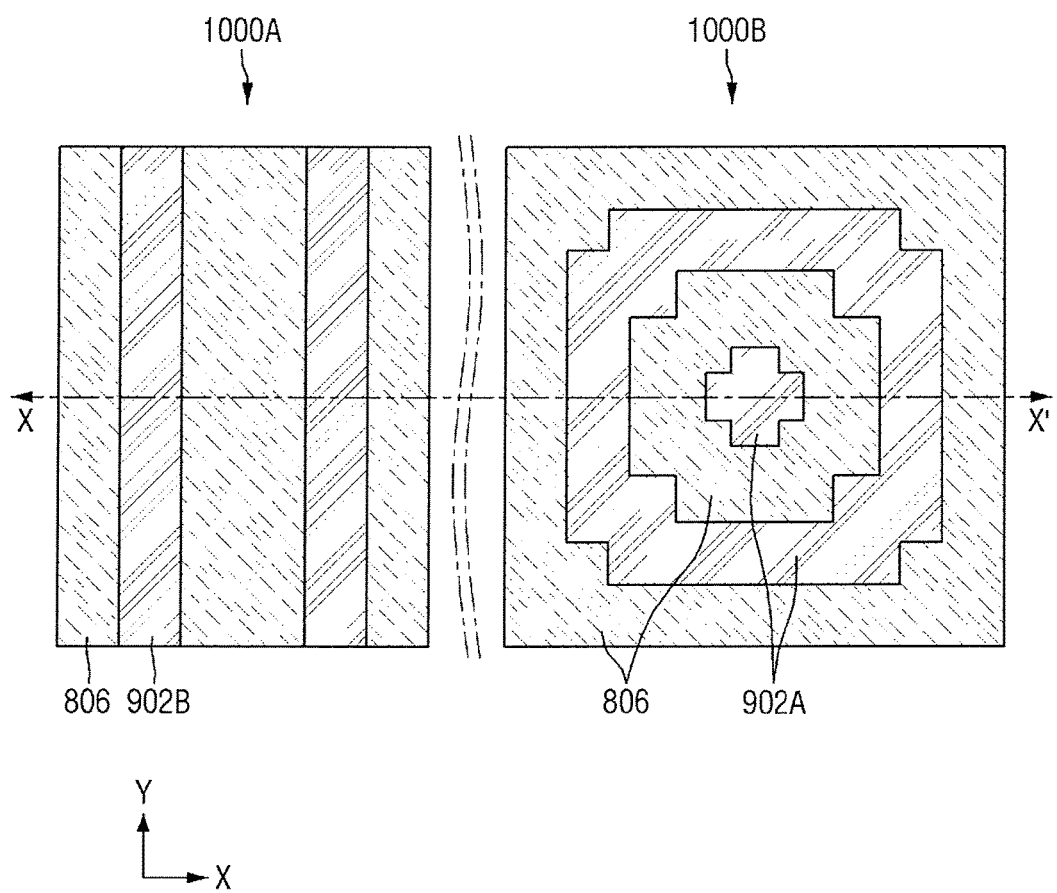
Figure 33B:
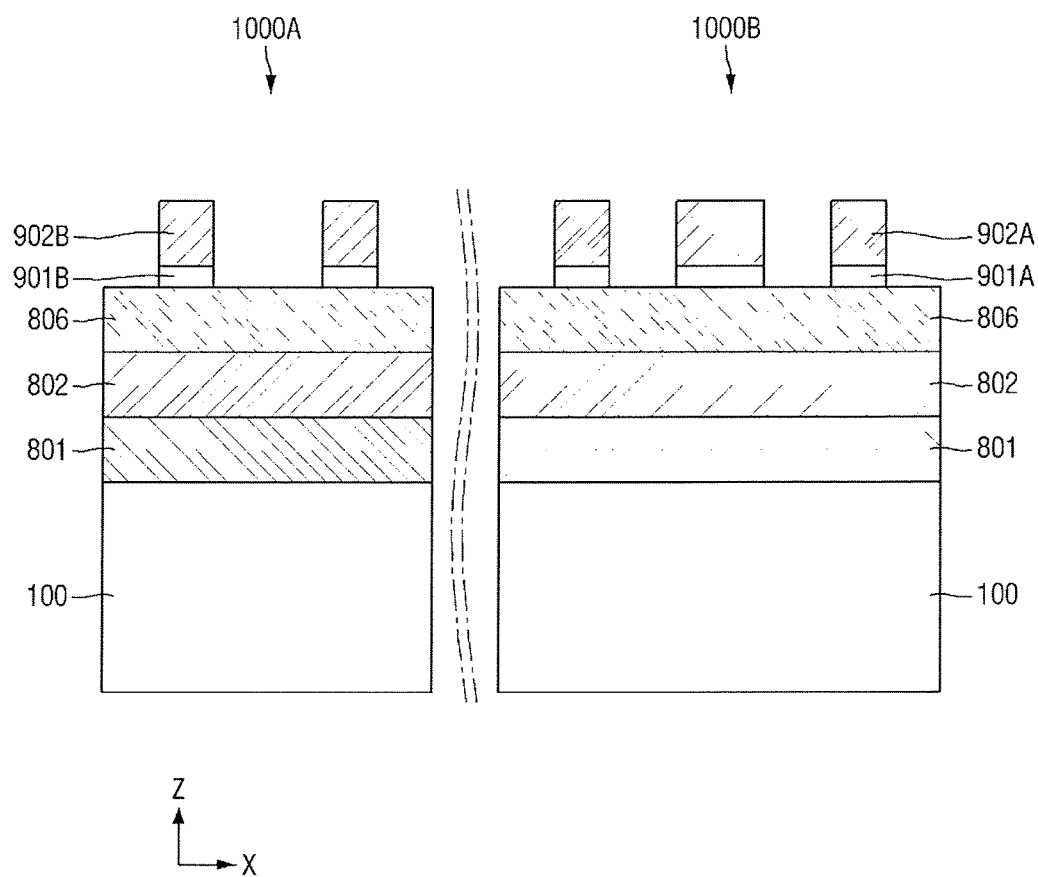

FIGS. 33A and 33B show oxide patterns 901A and 901B formed after performing step 1224-F according to an exemplary embodiment of the present inventive concept. The oxide layer 901 is patterned by etching exposed regions through SiN patterns 903A and 903B and the OPL patterns 902A and 902B to form the oxide patterns 901A and 901B. The etching process may use etchants of the oxide layer 901 having etch selectivity with respect to the upper mandrel layer 806. In the etching process, the SiN patterns 903A and 903B are removed. In an exemplary embodiment, the SiN patterns 903A and 903B may be partially removed.

Figure 34A:
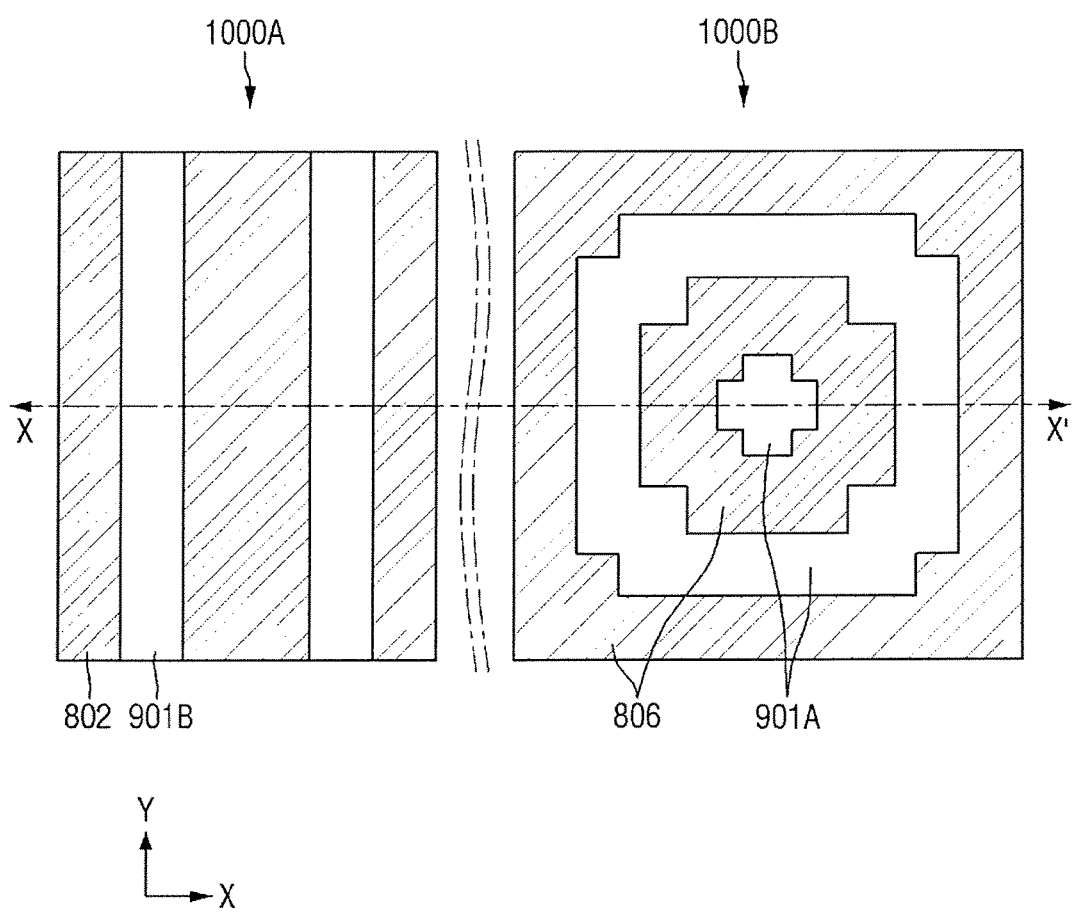
Figure 34B:
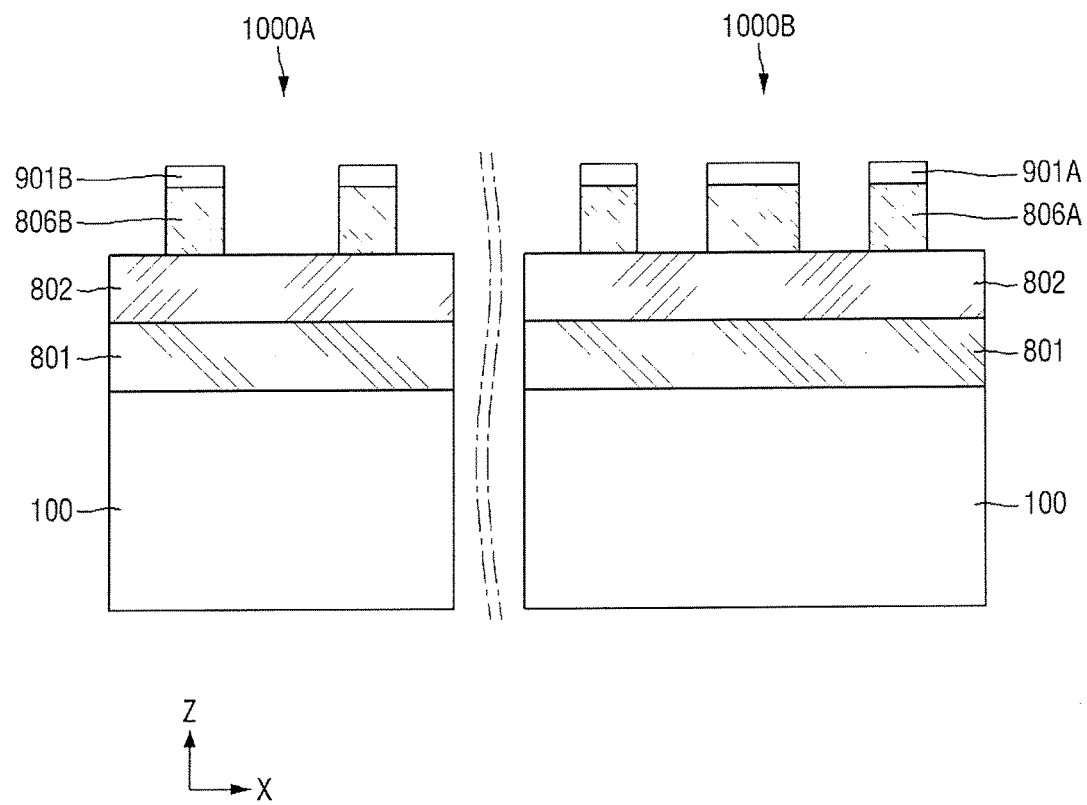

FIGS. 34A and 34B show upper mandrels 806A and 806B formed after performing step 1224-G according to an exemplary embodiment of the present inventive concept. The upper mandrel layer 806 is formed on the lower mandrel layer 802. The upper mandrel layer 806 is patterned by etching exposed regions through the oxide patterns 901A and 901B to form the upper mandrels 806A and 806B. The etching process may use etchants of the upper mandrel layer 806 having etch selectivity with respect to the lower mandrel layer 802. In an exemplary embodiment, the oxide patterns 901A and 901B may be removed so that the upper mandrel layer 806 is patterned to the upper mandrels 806A and 806B, as shown in FIGS. 25A and 25B, for example.

In an exemplary embodiment, the formation of the fin-type structures 200 and the overlay mark 300 of FIG. 1 may be performed according to an exemplary embodiment of the flowcharts of FIGS. 2, 6 (step 1000 of FIG. 2), 11 (step 1200 of FIG. 6), 18 (step 1300 of FIG. 6), 23 (step 1220 of FIG. 11) and 29 (step 1224 of FIG. 23).

Figure 35:
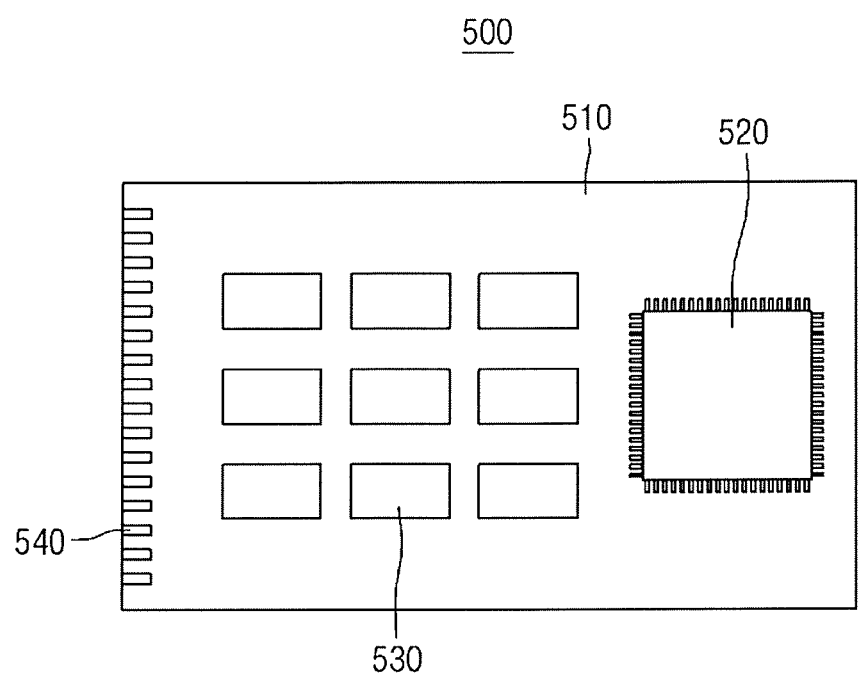
FIG. 35 is a semiconductor module having a semiconductor device fabricated according to an exemplary embodiment of the present inventive concept.

FIG. 35 is a semiconductor module having a semiconductor device fabricated according to an exemplary embodiment of the present inventive concept.

Referring to FIG. 35, the semiconductor module 500 includes a semiconductor device 530 according to an exemplary embodiment. The semiconductor device 530 is mounted on a semiconductor module substrate 510. The semiconductor module 500 further includes a microprocessor 520 mounted on the semiconductor module substrate 510. Input/output terminals 540 are disposed on at least one side of the semiconductor module substrate 510. The semiconductor module 500 may be included in a memory card or a solid state drive (SSD). In an exemplary embodiment, the microprocessor 520 may include a semiconductor device fabricated according to an exemplary embodiment.

Figure 36:
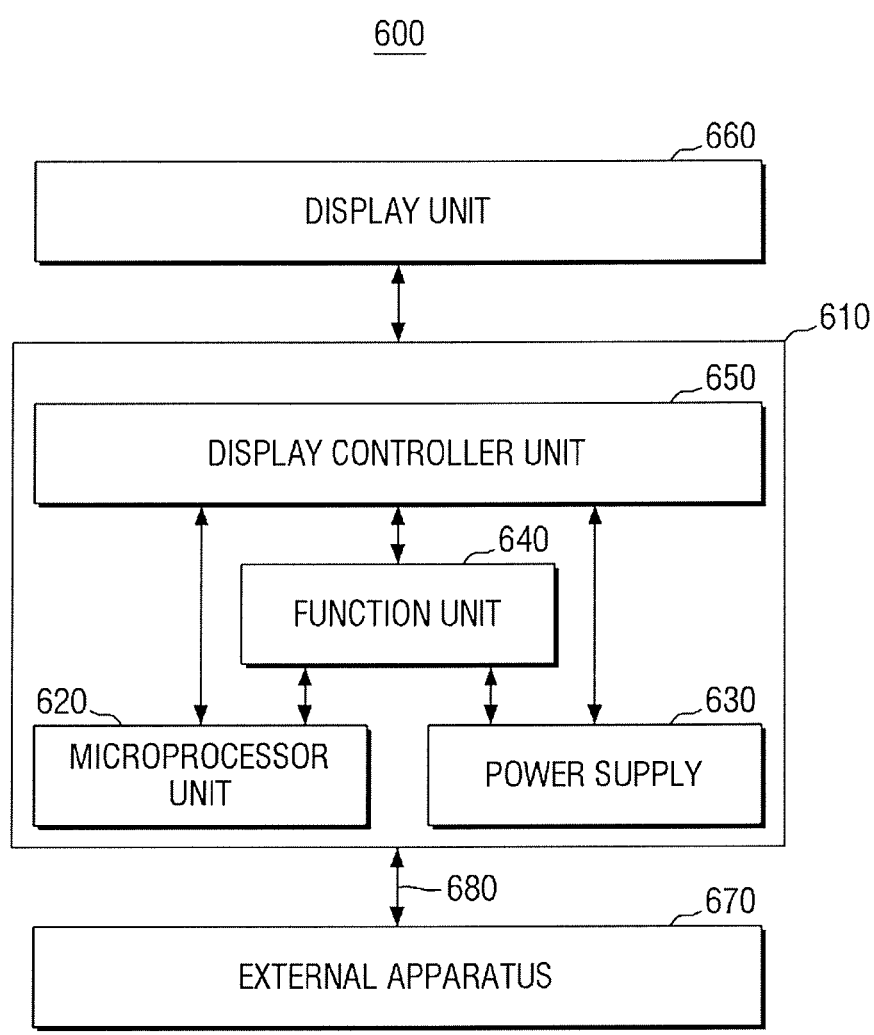
FIG. 36 is a block diagram of an electronic system having a semiconductor device according to an exemplary embodiment of the present inventive concept.

FIG. 36 is a block diagram of an electronic system having a semiconductor device according to an exemplary embodiment of the present inventive concept.

Referring to FIG. 36, a semiconductor device fabricated according to an exemplary embodiment of the present inventive concept is applied to the electronic system 600. The electronic system 600 includes a body 610, a microprocessor unit 620, a power supply 630, a function unit 640, and a display controller unit 650. The body 610 may include a system board or a motherboard having a printed circuit board (PCB) or the like. The microprocessor unit 620, the power supply 630, the function unit 640, and the display controller unit 650 are mounted or disposed on the body 610. A display unit 660 is disposed on an upper surface of the body 610 or outside the body 610. For example, the display unit 660 is disposed on a surface of the body 610, displaying an image processed by the display controller unit 650. The power supply 630 receives a constant voltage from an external power supply, generating various voltage levels to supply the voltages to the microprocessor unit 620, the function unit 640, the display controller unit 650, etc. The microprocessor unit 620 receives a voltage from the power supply 630 to control the function unit 640 and the display unit 660. The function unit 640 may perform various functions of the electronic system 600. For example, when the electronic system 600 is a mobile electronic product such as a cellular phone, or the like, the function unit 640 may include various components to perform wireless communication functions such as dialing, video output to the display unit 660 or voice output to a speaker through communication with an external device 670, and when a camera is included, it may serve as an image processor. If the electronic system 600 is connected to a memory card to expand the capacity, the function unit 640 may serve as a memory card controller. The function unit 640 may exchange signals with the external device 670 through a wired or wireless communication unit 680. Further, when the electronic system 600 requires a Universal Serial Bus (USB) to extend the functions, the function unit 640 may serve as an interface controller. The function unit 640 may include a semiconductor device fabricated according to an exemplary embodiment of the present inventive concept.

Figure 37:
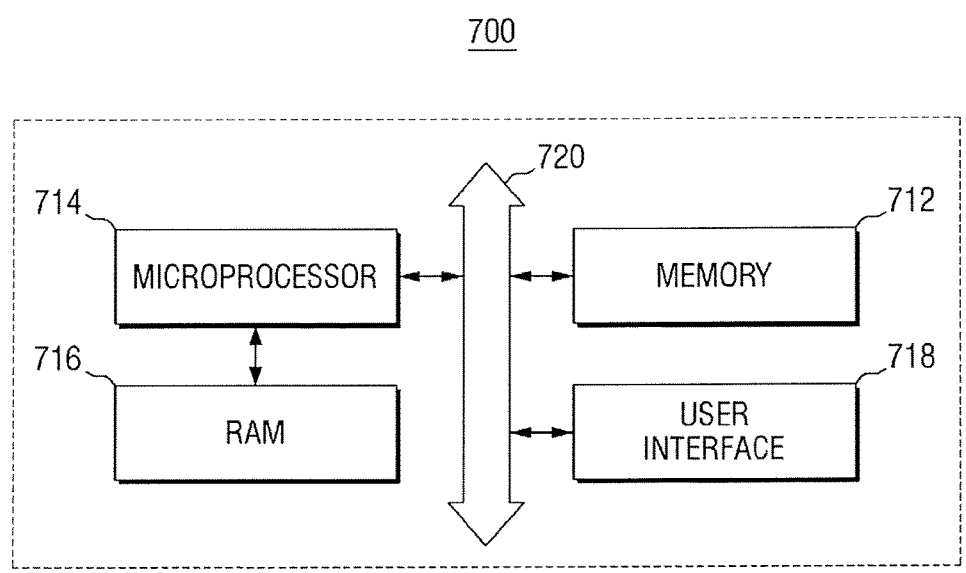
FIG. 37 is a block diagram of an electronic system having a semiconductor device fabricated according to an exemplary embodiment of the present inventive concept.

FIG. 37 is a block diagram of an electronic system having a semiconductor device fabricated according to an exemplary embodiment of the present inventive concept.

Referring to FIG. 37, the electronic system 700 may be included in a mobile device or a computer. For example, the electronic system 700 includes a memory system 712, a microprocessor 714, a random access memory (RAM) 716, and a user interface 718 configured to perform data communication using a bus 720. The microprocessor 714 may program and control the electronic system 700. The RAM 716 may be used as an operational memory of the microprocessor 714. For example, the microprocessor 714 or the RAM 716 may include a semiconductor device fabricated according an exemplary embodiment of the present inventive concept.

The microprocessor 714, the RAM 716, and/or other components may be assembled within a single package. The user interface 718 may be used to input or output data to or from the electronic system 700. The memory system 712 may store operational codes of the microprocessor 714, data processed by the microprocessor 714, or data received from the outside. The memory system 712 may include a controller and a memory.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of fabricating a semiconductor device, comprising:
    forming a target layer;
    forming a hard mask layer on the target layer;
    patterning the hard mask layer to form an overlay mask pattern including a first mask pattern and a plateau-shaped mask pattern, wherein the first mask pattern encloses the plateau-shaped mask pattern and the first mask pattern is spaced apart from the plateau-shaped mask pattern;
    patterning the target layer using the overlay mask pattern to form a redundant fin and a plateau-shaped overlay mark; and
    removing the redundant fin.

2. The method of claim 1,
    wherein the redundant fin is patterned using the first mask pattern, and
    wherein the plateau-shaped overlay mark is patterned using the plateau-shaped mask pattern.

3. The method of claim 1,
    wherein the hard mask layer is formed of silicon nitride, and
    wherein the target layer is formed of silicon or $Si_xGe_{1-x}$, where x is a positive real number less than 1.

4. The method of claim 1, further comprising:
    forming a lower mandrel on the hard mask layer, before the patterning of the hard mask layer,
    wherein the forming of the lower mandrel comprises:
        forming a lower mandrel layer (silicon layer) on the hard mask layer;
        patterning the lower mandrel layer to form the lower mandrel including a first lower mandrel and a second lower mandrel, wherein the first lower mandrel and the second lower mandrel are ring-shaped and concentric so that a first gap is formed between the first lower mandrel and the second lower mandrel, and wherein the second lower mandrel is positioned within the first lower mandrel and spaced apart from each other at a first distance.

5. The method of claim 4, further comprising:
    forming an upper mandrel on the lower mandrel layer, before the patterning of the lower mandrel layer,
    wherein the forming of the upper mandrel comprises:
        forming an upper mandrel layer (amorphous silicon layer) on the lower mandrel layer;
        patterning the upper mandrel layer to form the upper mandrel including a first upper mandrel and a second upper mandrel, wherein the first upper mandrel is ring-shaped and the second upper mandrel is cross-hair shaped, wherein the first upper mandrel encloses the second upper mandrel, and wherein the first upper mandrel and the second upper mandrel are concentric so that a second gap is formed between the first upper mandrel and the second upper mandrel.

6. The method of claim 5, further comprising:
    forming a preliminary upper mask layer so that the preliminary upper mask layer conformally covers the first upper mandrel and the second upper mandrel without filling the second gap;

performing an anisotropic etching process on the preliminary upper mask layer to form a plurality of upper mask patterns, wherein each upper mask pattern is disposed on a sidewall of each of the first upper mandrel and the second upper mandrel; and removing the first upper mandrel and the second upper mandrel after the performing of the anisotropic etching process, wherein the upper mask patterns are spaced apart from each other, and wherein the patterning of the lower mandrel layer is performed using the upper mask patterns.

7. The method of claim 5,
wherein the upper mandrel layer is formed of amorphous carbon.

8. The method of claim 4,
wherein the lower mandrel layer is formed of silicon.

9. The method of claim 4, further comprising:
forming a preliminary lower mask layer (an oxide layer) on the first lower mandrel and the second lower mandrel so that the preliminary lower mask layer completely fills the first gap;

performing an anisotropic etching process on the preliminary lower mask layer to form a lower mask pattern including a first lower mask pattern, a second lower mask pattern and a third lower mask pattern, wherein the second lower mask pattern is positioned within the first gap and completely fills the first gap, wherein the first lower mask pattern is formed on an outer sidewall of the first lower mandrel, and wherein the third lower mask pattern is formed on an inner sidewall of the second lower mandrel; and removing the lower mandrel,
wherein the first lower mask pattern, the second lower mask pattern and the third lower mask pattern are spaced apart from each other.

10. The method of claim 9,
wherein the first lower mask pattern, the second lower mask pattern and the third lower mask pattern are ring-shaped and concentric, and
wherein the second lower mask pattern is positioned between the first lower mask pattern and the third lower mask pattern.

11. The method of claim 9,
wherein the preliminary lower mask layer is formed of silicon oxide.

12. The method of claim 9, further comprising:
forming an organic planarizing layer (OPL) so that the OPL completely covers the third lower mask pattern and partially covers the second lower mask pattern,
wherein a sidewall of the OPL is positioned on an upper surface of the second lower mask pattern, and
wherein the OPL has a first thickness.

13. The method of claim 12,
wherein the patterning of the hard mask layer is performed by an etching process using the first lower mask pattern, the second lower mask pattern and the OPL as an etch mask,
wherein the first lower mask pattern is used to form the first mask pattern, and
wherein a combined mask structure of the second lower mask pattern and the OPL is used to form the plateau-shaped mask pattern.

14. The method of claim 1,
wherein an upper surface of the redundant fin and an upper surface of the plateau-shaped overlay mark are substantially coplanar.

15. A method of forming a semiconductor device, comprising:
forming a target layer to be patterned to be a plateau-shaped overlay mark and a plurality of active fins;
forming a hard mask layer on the target layer;
forming a silicon layer on the hard mask layer;
patterning the silicon layer to form a plurality of line-shaped silicon patterns and a first ring-shaped silicon pattern and a second ring-shaped silicon pattern, wherein the line-shaped silicon patterns are spaced apart from each other at a first distance and the first ring-shaped silicon pattern is spaced apart from the second ring-shaped silicon pattern at a second distance smaller than the first distance;
forming an oxide layer on the line-shaped silicon patterns, the first ring-shaped silicon pattern and the second ring-shaped silicon pattern so that the oxide layer completely fills a gap between the first-ring shaped silicon pattern and the second ring-shaped silicon pattern;
performing an anisotropic etching process on the oxide layer to form a plurality of line-shaped oxide patterns and a first ring-shaped oxide pattern, a second ring-shaped oxide pattern and a third ring-shaped oxide pattern,
wherein the line-shaped oxide patterns are formed on sidewalls of the line-shaped silicon patterns,
wherein the first ring-shaped oxide pattern is formed on an outer sidewall of the first ring-shaped silicon pattern,
wherein the second ring-shaped oxide pattern is formed between an inner sidewall of the first ring-shaped silicon pattern and an outer sidewall of the second ring-shaped silicon pattern and completely fills the gap between the first ring-shaped silicon pattern and the second ring-shaped silicon pattern, and
wherein the third ring-shaped oxide pattern is formed on an inner sidewall of the second ring-shaped silicon pattern;
removing the line-shaped silicon patterns, the first ring-shaped silicon pattern and the second ring-shaped silicon pattern;
forming an organic planarizing layer (OPL) so that a sidewall of the OPL is positioned on an upper surface of the second ring-shaped oxide pattern, wherein the OPL has a first thickness;
patterning the hard mask layer to form a plurality of line-shaped mask patterns and to form a plateau-shaped mask pattern, respectively, using the line-shaped oxide patterns and a combined structure of the OPL and the second ring-shaped oxide pattern; and
patterning the target layer using the line-shaped mask patterns and the plateau-shaped mask pattern so that the active fins are formed under the line-shaped mask patterns and the plateau-shaped overlay mark are formed under the plateau-shaped pattern.

16. A method of fabricating a semiconductor device, comprising:
forming a target layer on a substrate, the target layer having a device region and an overlay mark region;
etching the device region and the overlay mark region to form a plurality of active fins and form a plateau-shaped overlay mark, respectively;
forming a metal layer on the active fins; and aligning a photomask to the active fins using the plateau-shaped overlay mark, wherein the photomask is used to pattern the metal layer to form a plurality of gate electrodes.

17. The method of claim 16, further comprising:
forming a hard mask layer on the target layer;
forming a plurality of lower mandrels on the hard mask layer, the lower mandrels including a plurality of first lower mandrels, a second lower mandrel and a third lower mandrel, wherein the first lower mandrels are line-shaped and formed on the device region, wherein the second lower mandrel and the third lower mandrel are ring-shaped and formed on the overlay mark region; and
forming a plurality of lower mask patterns including a plurality of first lower mask patterns, a second lower mask pattern, a third lower mask pattern and a fourth lower mask pattern, wherein the first lower mask patterns are formed on sidewalls of the first lower mandrels, wherein the second lower mask pattern is formed on an outer sidewall of the second lower mandrel, wherein the third lower mask pattern is formed between an inner sidewall of the second lower mandrel and an outer sidewall of the third lower mandrel, wherein the fourth lower mask pattern is formed on an inner sidewall of the third lower mandrel, and wherein a thickness of the third lower mask pattern is about twice a thickness of the second lower mask pattern.

18. The method of claim 17, further comprising:
after the forming of the lower mask patterns,
removing the lower mandrels;
forming an organic planarizing layer (OPL) covering completely the fourth lower mask pattern and covering partially the third lower mask pattern and exposing the second lower mask pattern and the first lower mask patterns,
wherein a sidewall of the OPL is formed on an upper surface of the third lower mask pattern.

19. The method of claim 18, further comprising:
patterning the hard mask layer using the lower mask patterns and the OPL to form a plurality of fin mask patterns and a plateau-shaped overlay mark pattern on the device region and the overlay mark region, respectively.

20. The method of claim 19,
wherein the fin mask patterns are formed using the first lower mask patterns,
wherein the plateau-shaped overlay mark pattern is formed using a combined mask of the third lower mask pattern and the OPL.

* * * * *